(12) United States Patent
Xie et al.

(10) Patent No.: US 12,500,144 B2
(45) Date of Patent: Dec. 16, 2025

(54) BACKSIDE SELF ALIGNED SKIP VIA

(71) Applicant: INTERNATIONAL BUSINESS MACHINES CORPORATION, Armonk, NY (US)

(72) Inventors: Ruilong Xie, Niskayuna, NY (US); Biswanath Senapati, Mechanicville, NY (US); David Wolpert, Poughkeepsie, NY (US); Nicholas Anthony Lanzillo, Wynantskill, NY (US); Lawrence A. Clevenger, Saratoga Springs, NY (US); Leon Sigal, Monsey, NY (US); Brent A. Anderson, Jericho, VT (US); Albert M. Chu, Nashua, NH (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 377 days.

(21) Appl. No.: 18/312,613

(22) Filed: May 5, 2023

(65) Prior Publication Data

US 2024/0371729 A1 Nov. 7, 2024

(51) Int. Cl.
*H01L 23/48* (2006.01)
*H10D 30/43* (2025.01)
*H10D 30/67* (2025.01)
*H10D 62/10* (2025.01)

(52) U.S. Cl.
CPC ....... *H01L 23/481* (2013.01); *H10D 30/6729* (2025.01); *H10D 30/43* (2025.01); *H10D 30/6735* (2025.01); *H10D 30/6757* (2025.01); *H10D 62/121* (2025.01)

(58) Field of Classification Search
CPC .......... H01L 21/76897; H01L 23/5226; H01L 23/481; H01L 21/76895; H01L 2225/06541; H10D 30/6729; H10D 30/6735
See application file for complete search history.

(56) References Cited

U.S. PATENT DOCUMENTS

| | | |
|---|---|---|
| 8,274,101 B2 | 9/2012 | Venezia |
| 9,455,214 B2 | 9/2016 | Maling |
| 9,673,081 B2 | 6/2017 | Jebory |
| 9,997,607 B2 | 6/2018 | Hook |
| 10,636,739 B2 | 4/2020 | Beyne |
| 10,643,927 B1 | 5/2020 | Shank |
| 10,797,139 B2 | 10/2020 | Morrow |
| 10,985,103 B2 | 4/2021 | Hong |
| 2018/0218973 A1 | 8/2018 | Nelson |
| 2019/0164882 A1 | 5/2019 | Chen et al. |
| 2020/0105671 A1 | 4/2020 | Lai |

(Continued)

OTHER PUBLICATIONS

Ryckaert et al., "Extending the roadmap beyond 3nm through system scaling boosters: A case study on Buried Power Rail and Backside Power Delivery", 2019 Electron Devices Technology and Manufacturing Conference (EDTM), pp. 50-52.

*Primary Examiner* — Davienne N Monbleau
(74) *Attorney, Agent, or Firm* — L. Jeffrey Kelly

(57) ABSTRACT

A semiconductor structure including a gate contact above and in direct contact with a top surface of a gate, a backside wiring layer below a backside power delivery network, and a contact via extending between the gate contact and the backside wiring layer.

20 Claims, 26 Drawing Sheets

(56) References Cited

U.S. PATENT DOCUMENTS

| | | |
|---|---|---|
| 2021/0104435 A1 | 4/2021 | Son |
| 2021/0111115 A1 | 4/2021 | Morrow |
| 2021/0118798 A1 | 4/2021 | Liebmann |
| 2021/0134721 A1 | 5/2021 | Chiang |
| 2021/0202385 A1 | 7/2021 | Huang |
| 2022/0310455 A1* | 9/2022 | Huang ............... H10D 30/6757 |
| 2023/0086033 A1* | 3/2023 | Xie ..................... H10D 62/121 |
| | | 257/401 |
| 2023/0402318 A1* | 12/2023 | Xie .................... H01L 23/5283 |
| 2024/0079476 A1* | 3/2024 | Li ..................... H01L 21/76897 |
| 2024/0136253 A1* | 4/2024 | Lanzillo ............. H10D 30/6735 |
| 2024/0162118 A1* | 5/2024 | Xie .................... H10D 30/6735 |

* cited by examiner

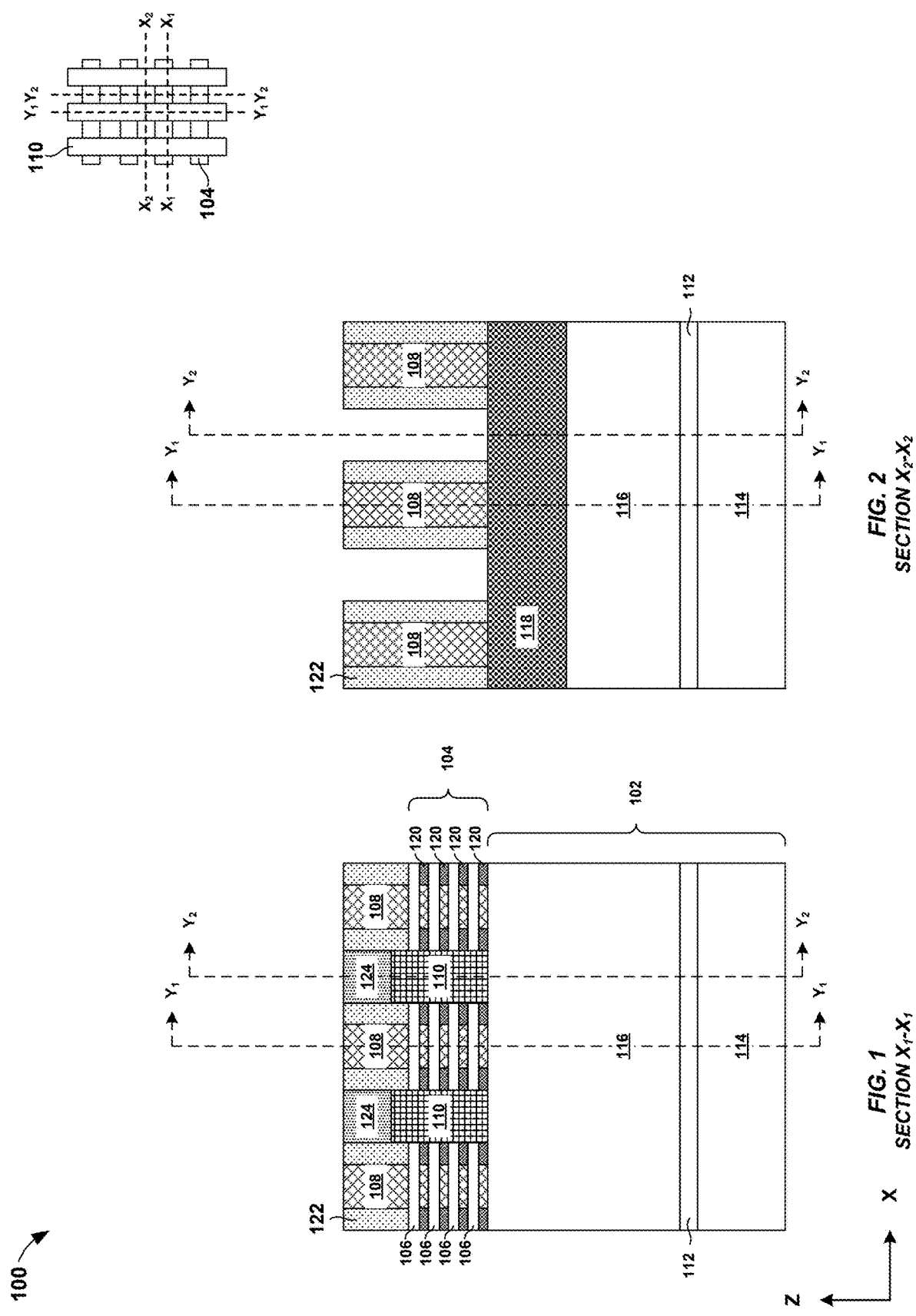

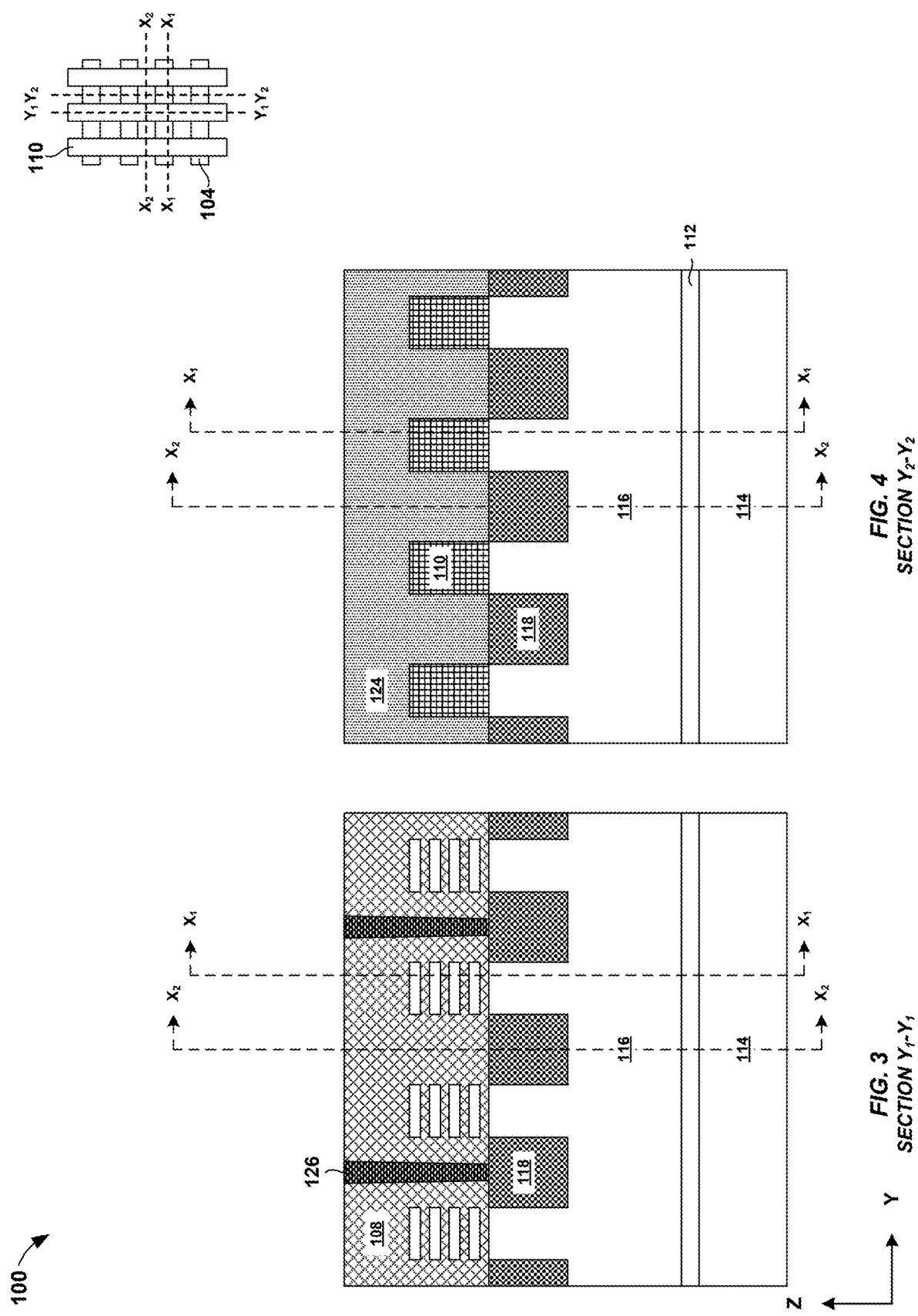

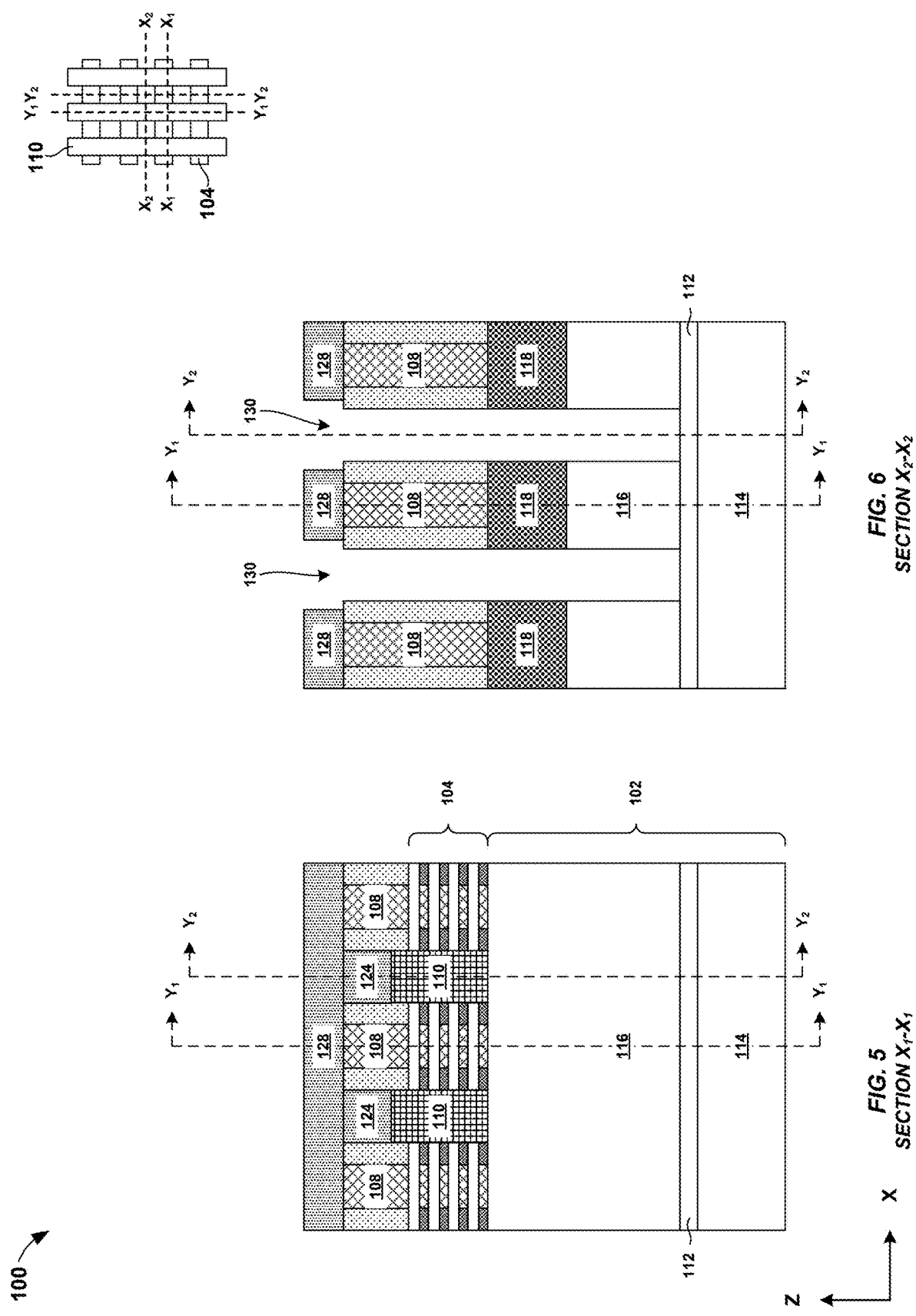

SECTION Y₁-Y₁

SECTION Y₂-Y₂

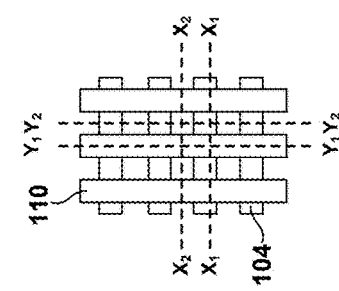
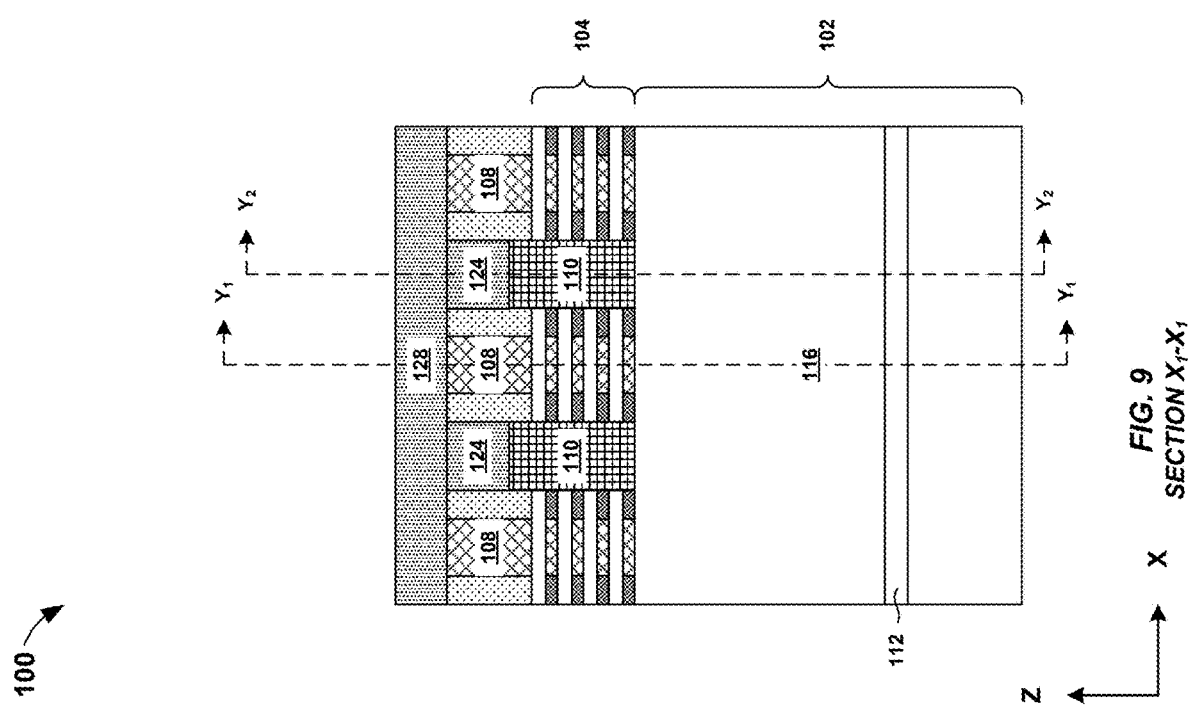
FIG. 10
SECTION $X_2$-$X_2$
FIG. 9
SECTION $X_1$-$X_1$

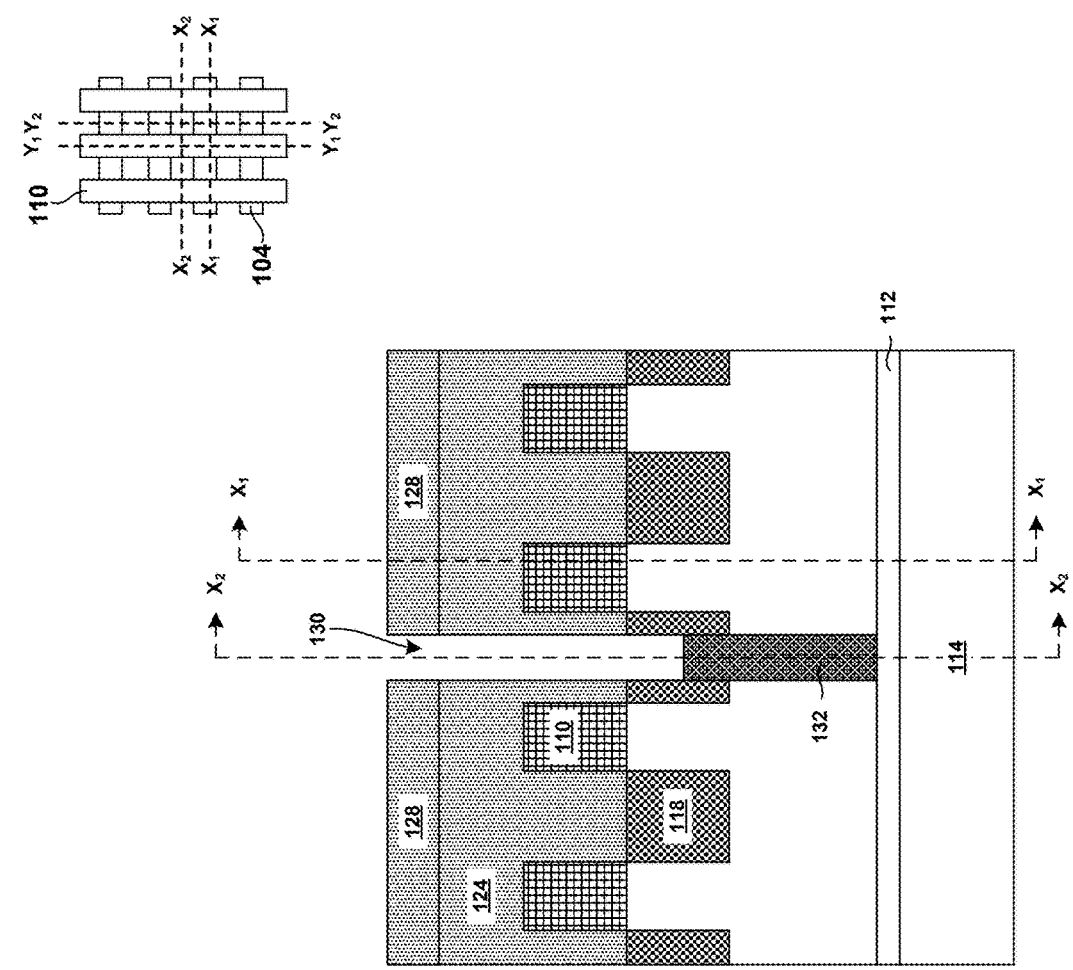
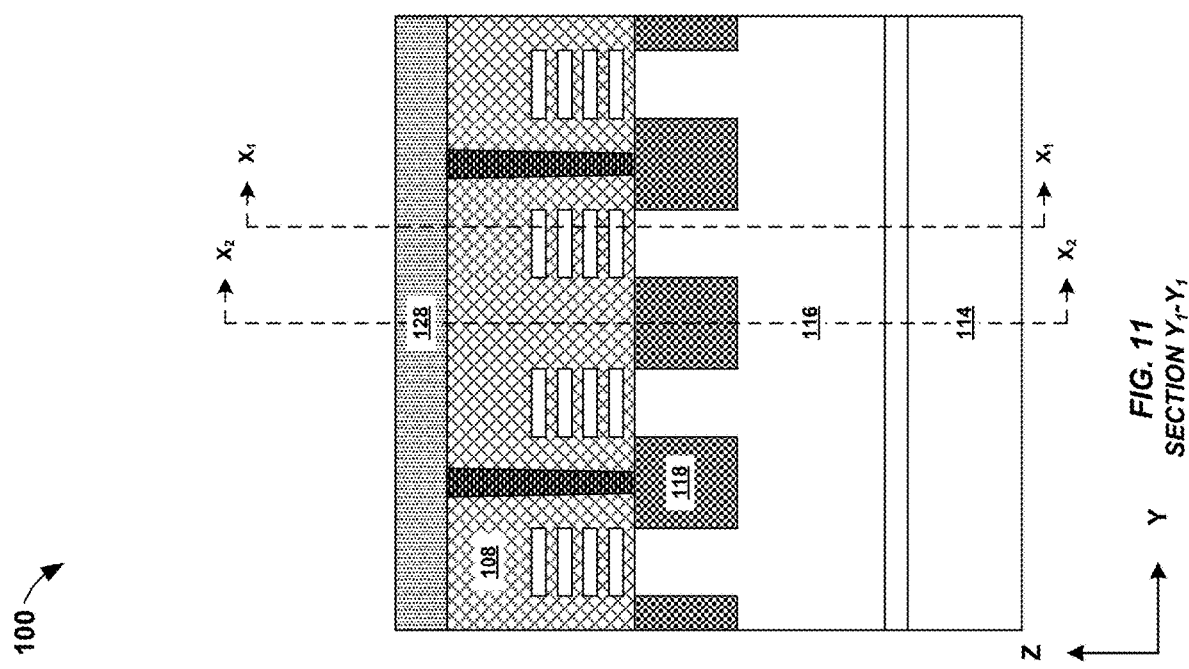
FIG. 11 SECTION Y₁-Y₁
FIG. 12 SECTION Y₂-Y₂

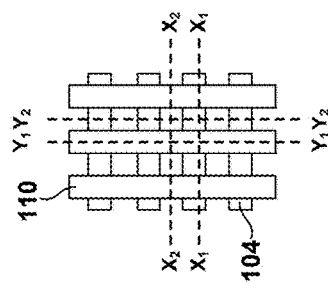
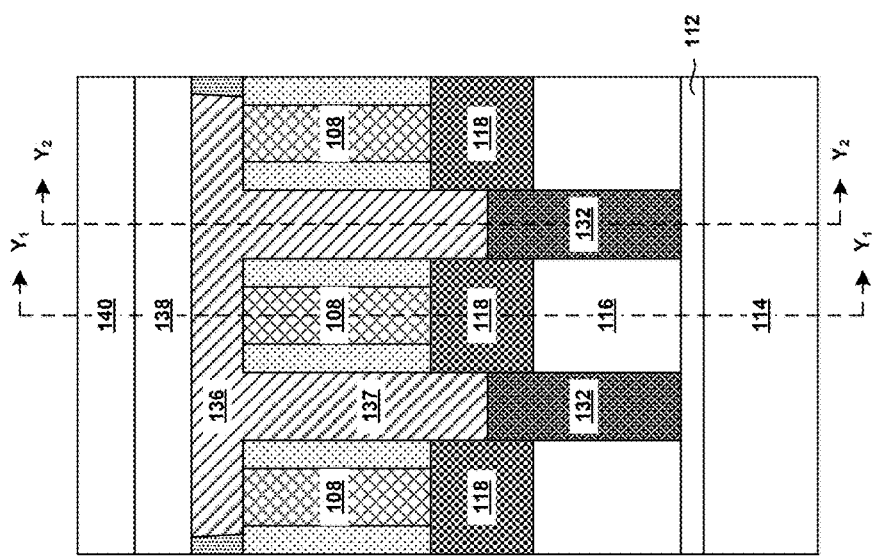
FIG. 14
SECTION X₂-X₂
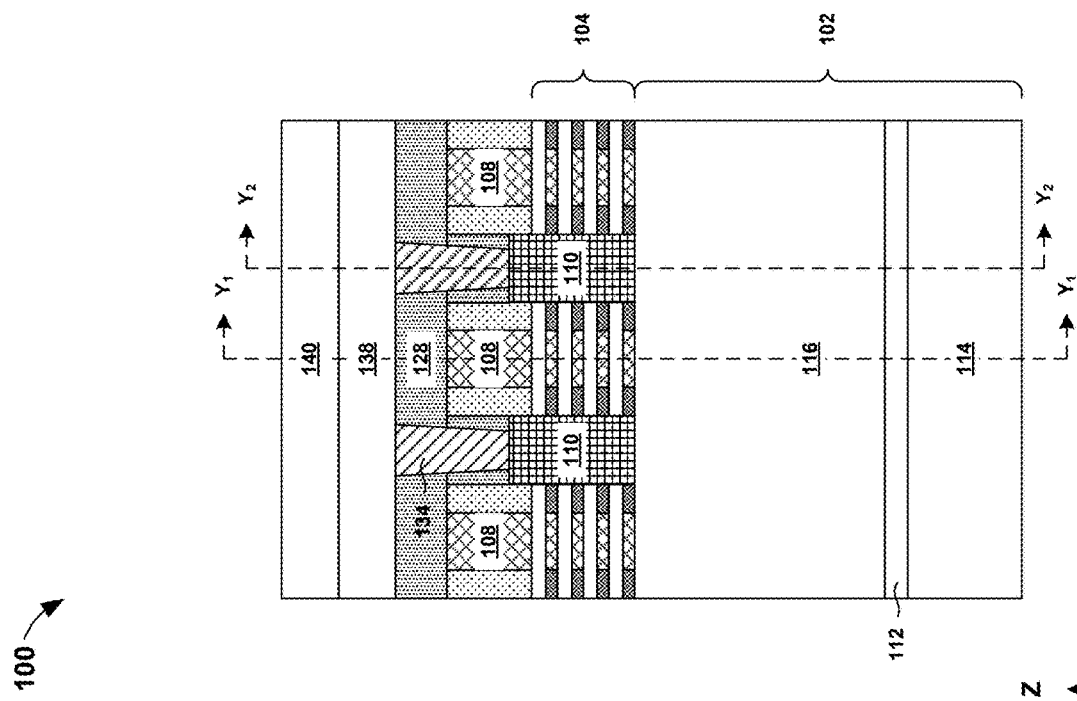
FIG. 13
SECTION X₁-X₁

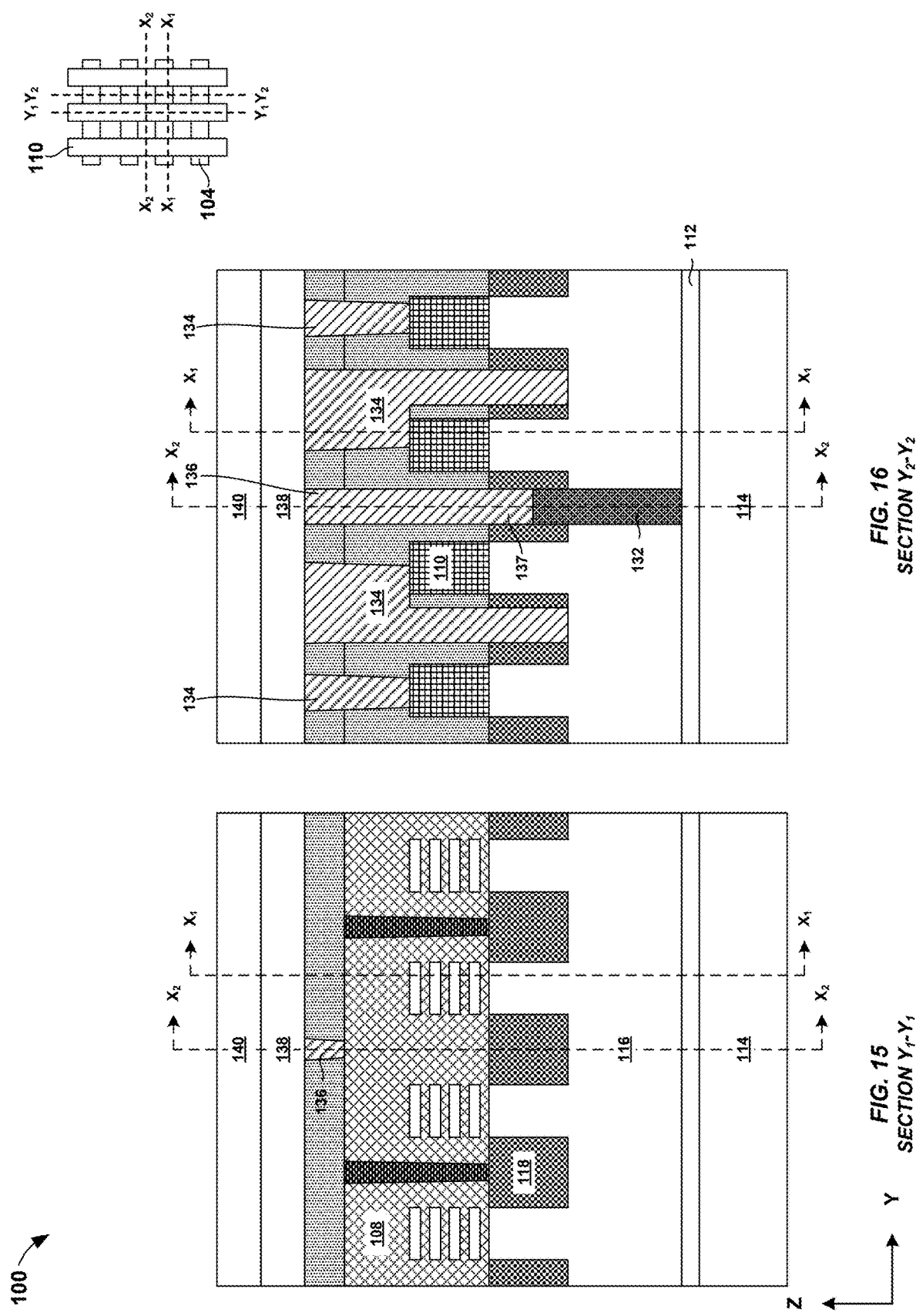
FIG. 15 SECTION Y₁-Y₁
FIG. 16 SECTION Y₂-Y₂

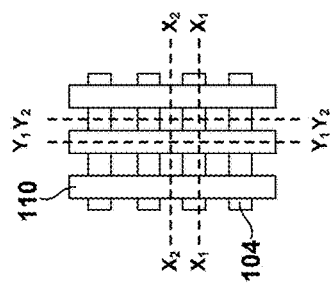
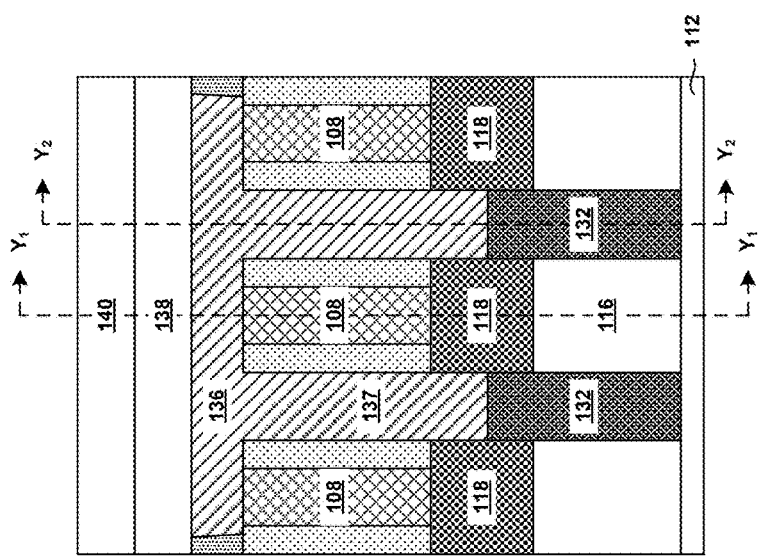
FIG. 18
SECTION X₂-X₂
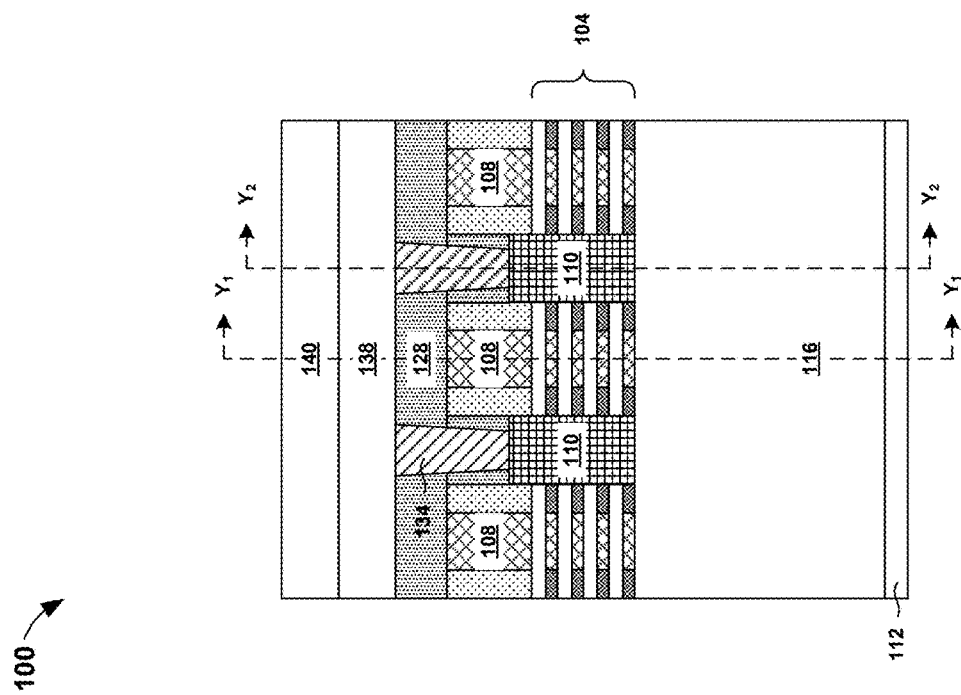
FIG. 17
SECTION X₁-X₁

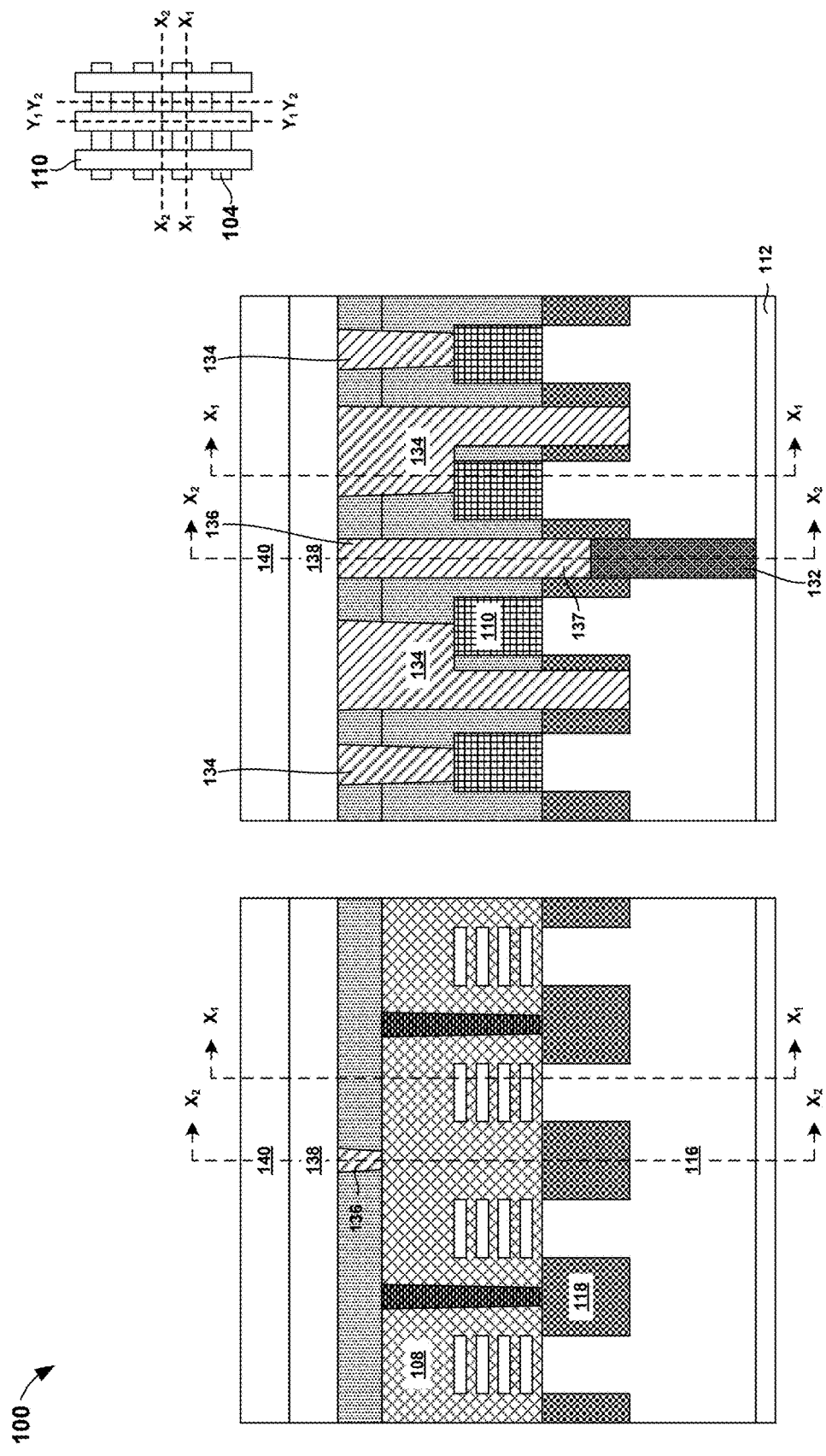
FIG. 19 SECTION Y₁-Y₁
FIG. 20 SECTION Y₂-Y₂

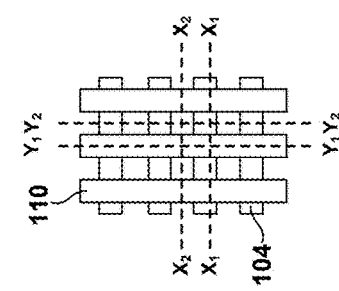
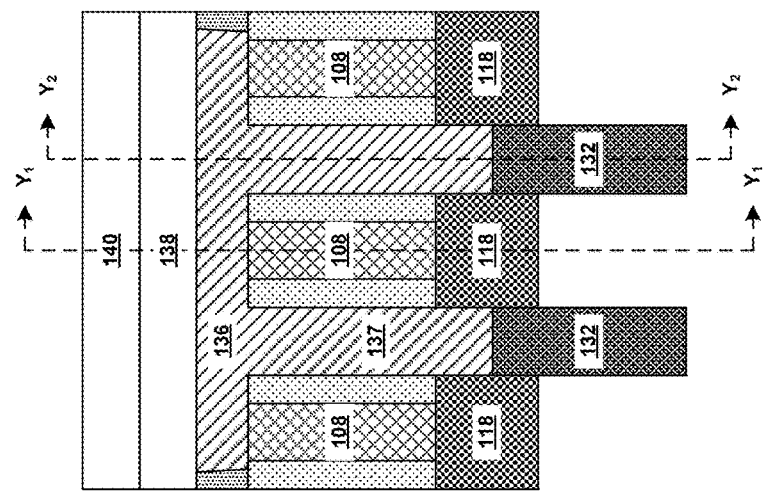
*FIG. 22*
SECTION X₂-X₂
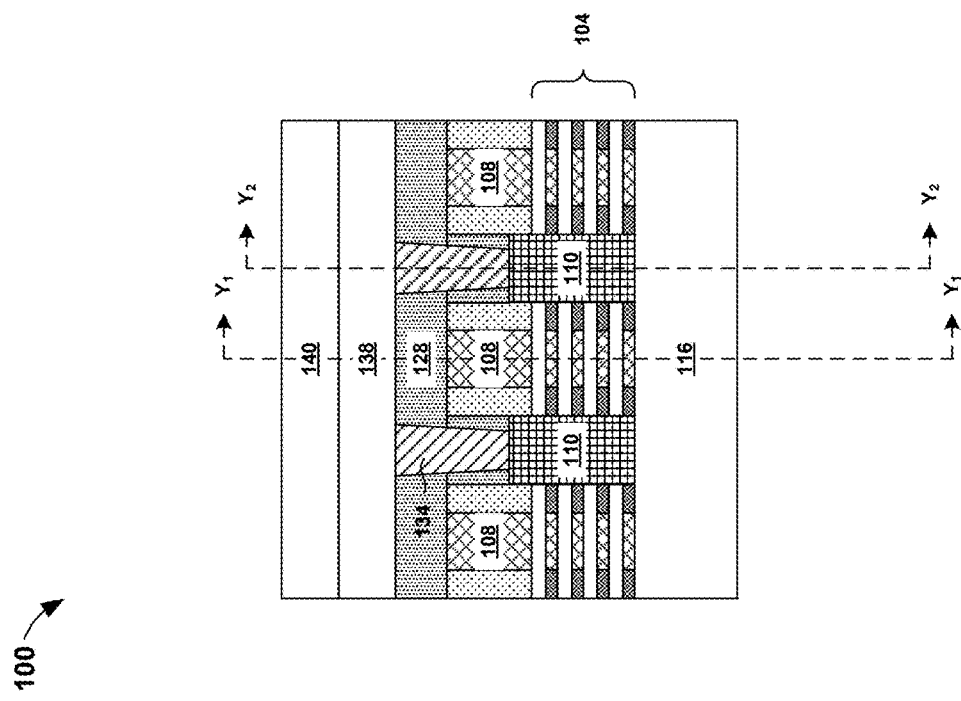
*FIG. 21*
SECTION X₁-X₁

SECTION Y₁-Y₁

SECTION Y₂-Y₂

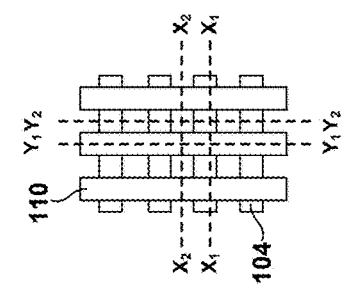
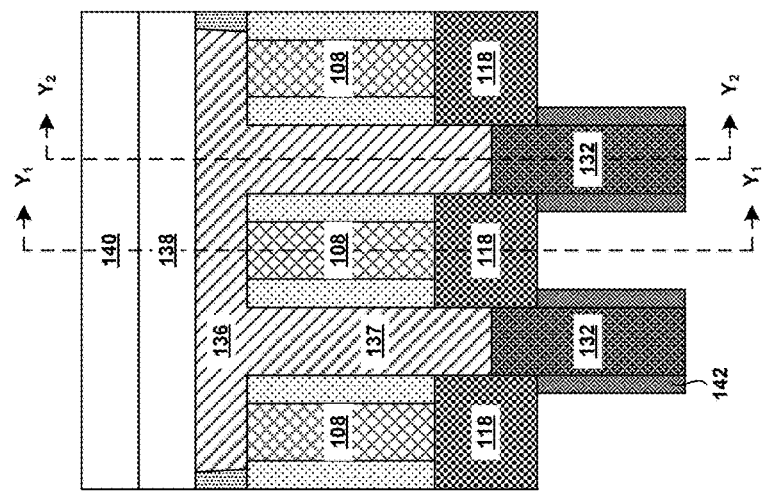
*FIG. 26*
*SECTION X₂-X₂*
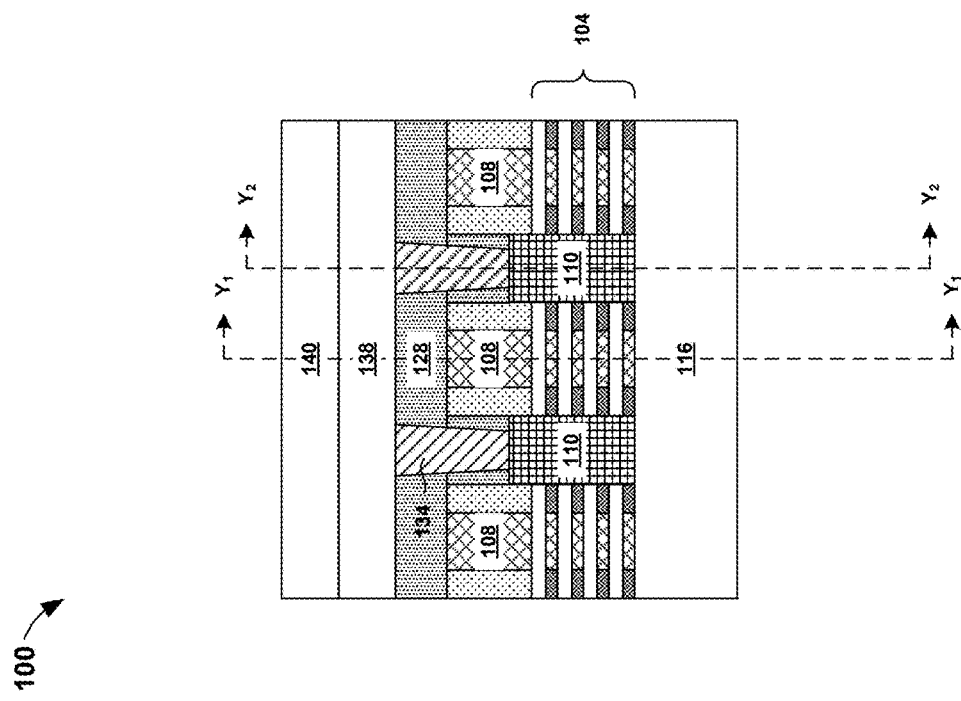
*FIG. 25*
*SECTION X₁-X₁*
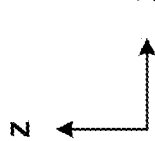

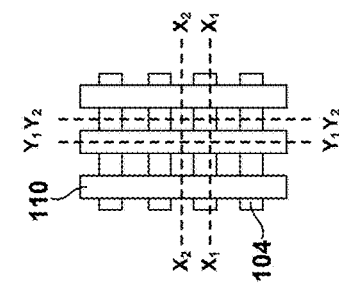
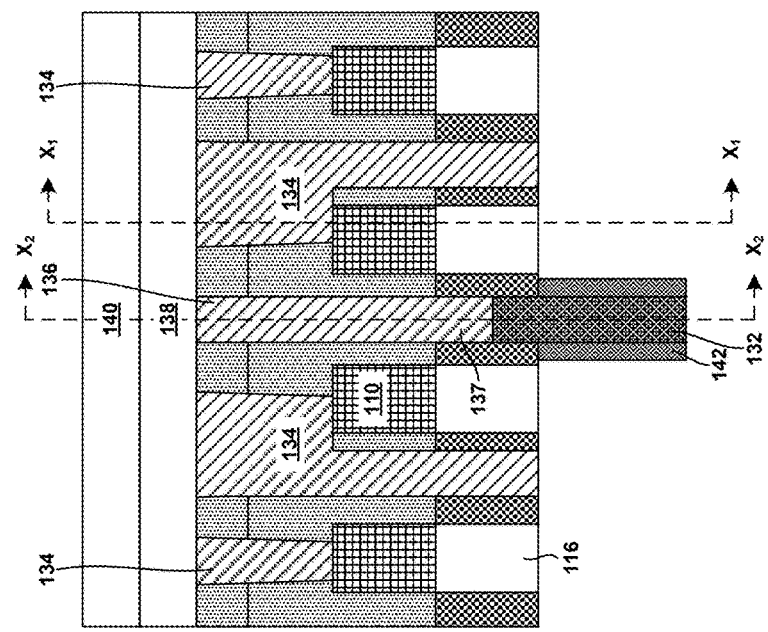
*FIG. 28*
*SECTION Y₂-Y₂*
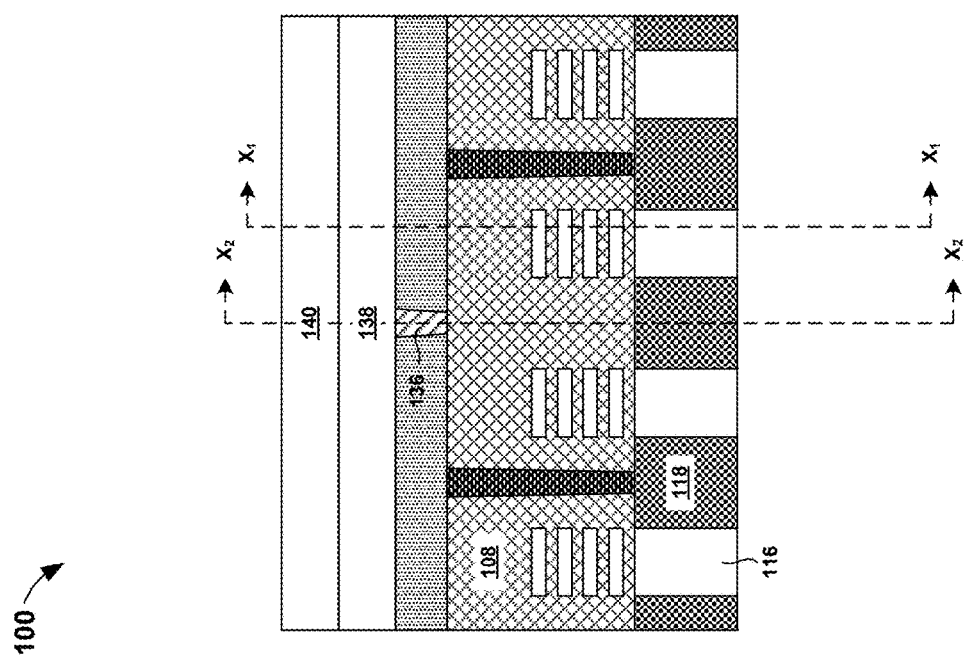
*FIG. 27*
*SECTION Y₁-Y₁*

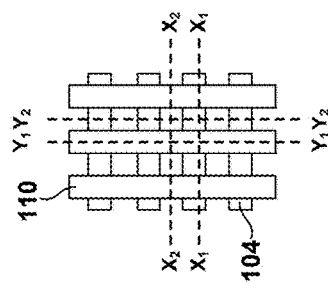
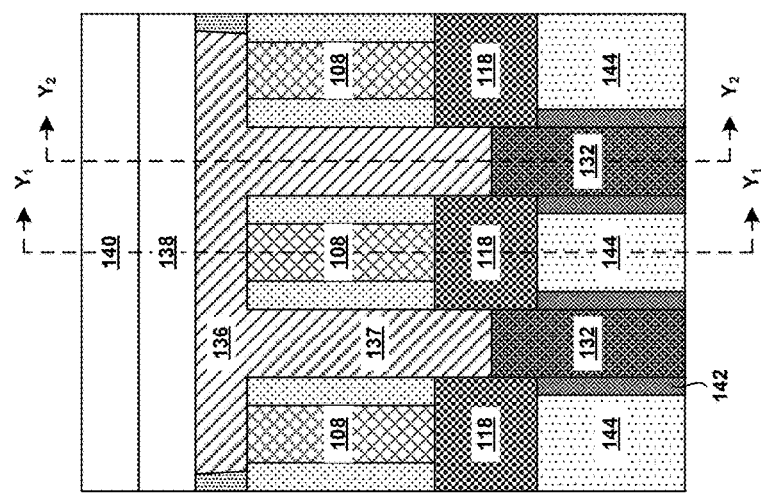
FIG. 30
SECTION $X_2$-$X_2$
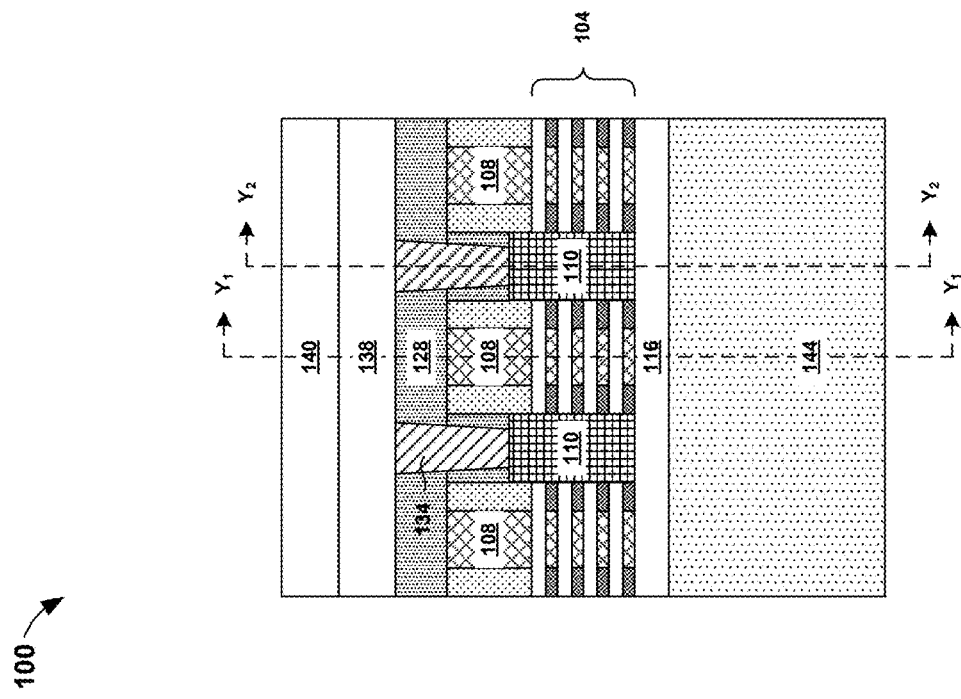
FIG. 29
SECTION $X_1$-$X_1$

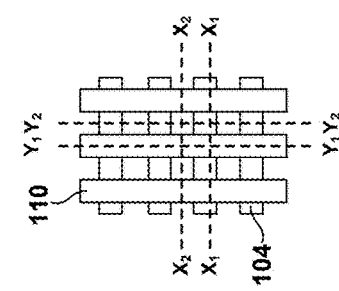
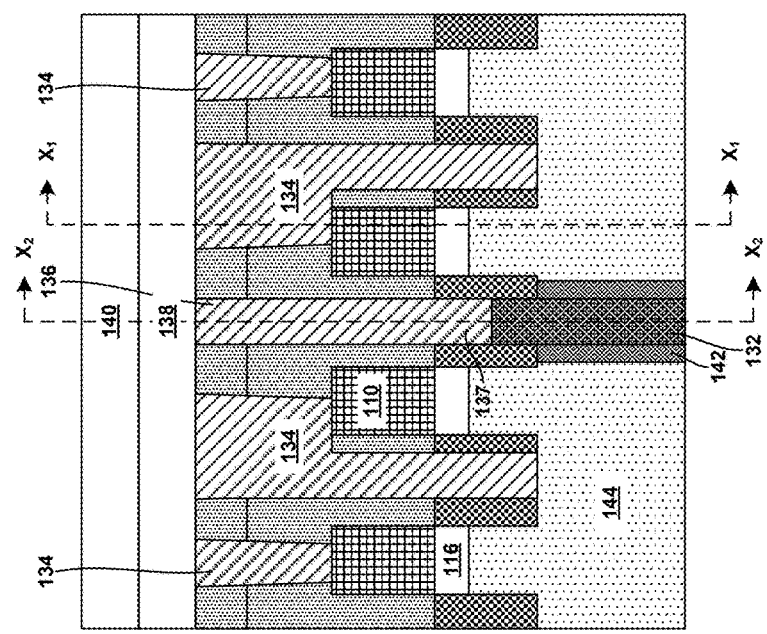
FIG. 32
SECTION $Y_2$-$Y_2$
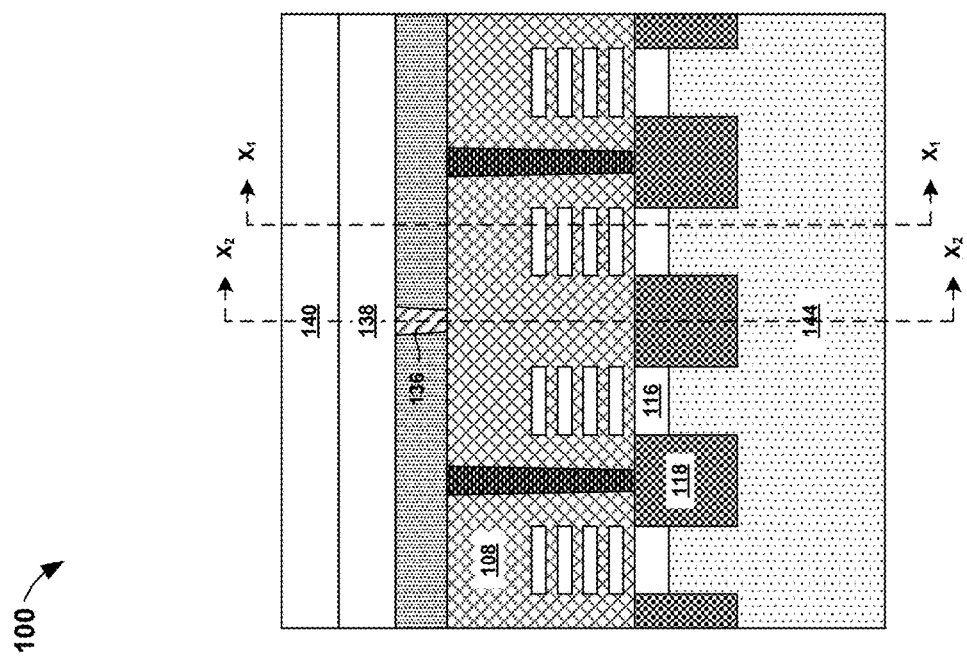
FIG. 31
SECTION $Y_1$-$Y_1$

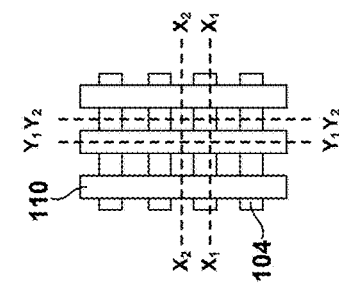
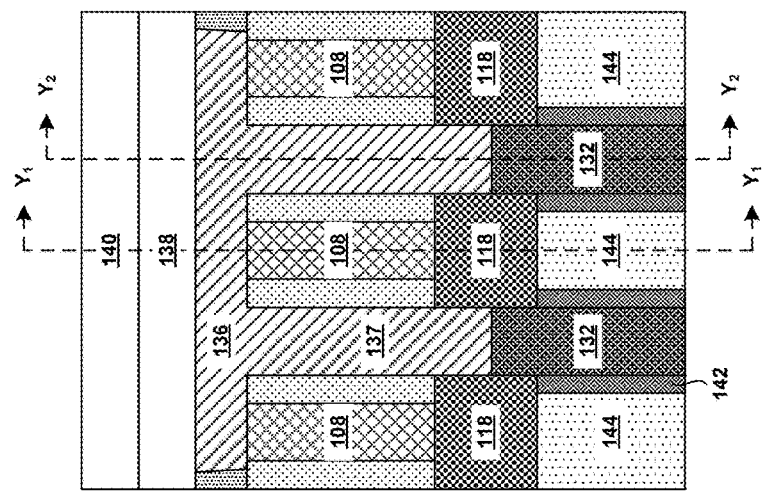
*FIG. 34*
*SECTION $X_2$-$X_2$*
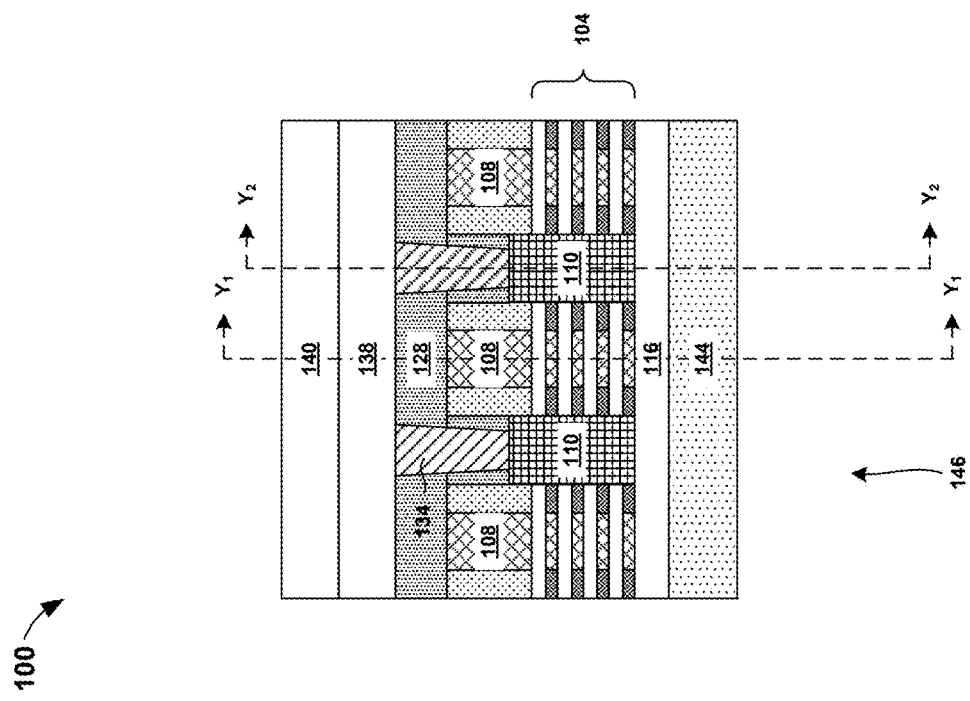
*FIG. 33*
*SECTION $X_1$-$X_1$*

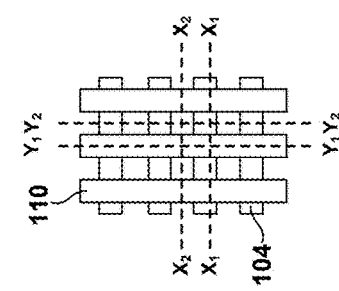
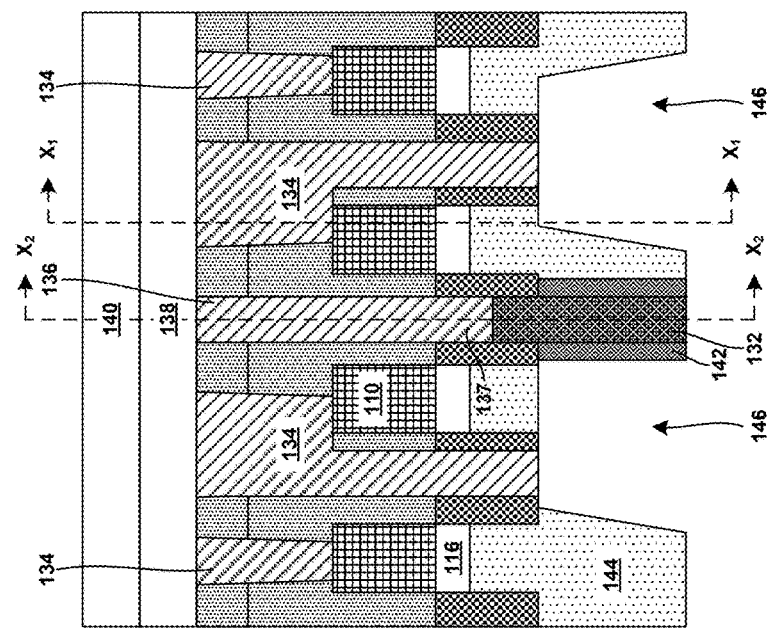
*FIG. 36*
*SECTION $Y_2$-$Y_2$*
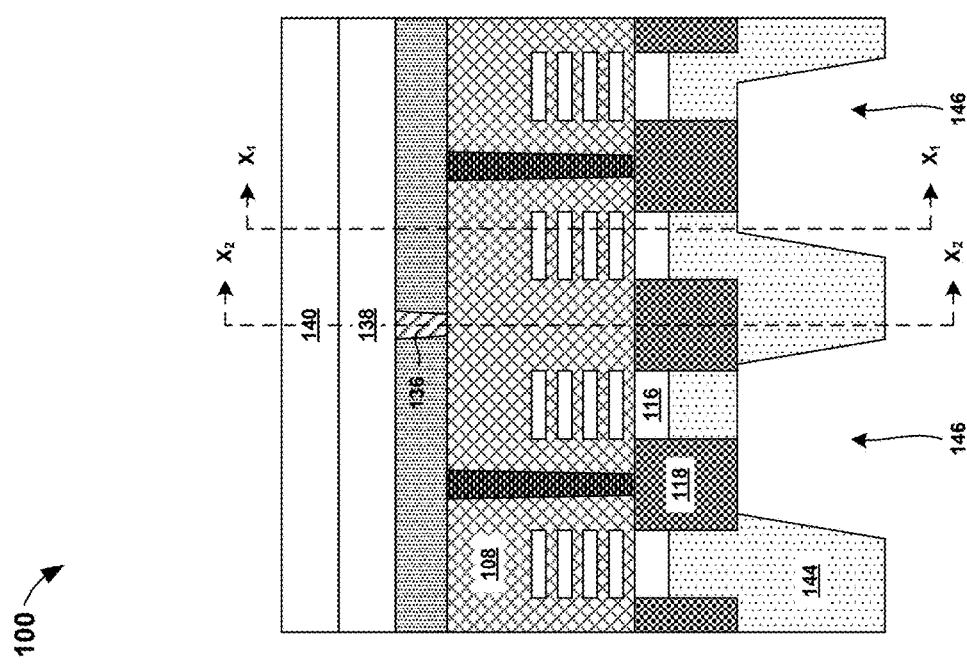
*FIG. 35*
*SECTION $Y_1$-$Y_1$*

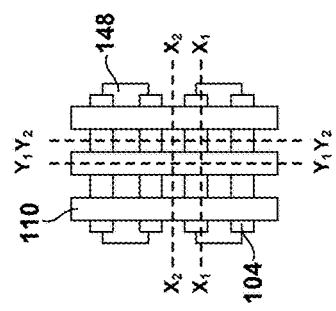
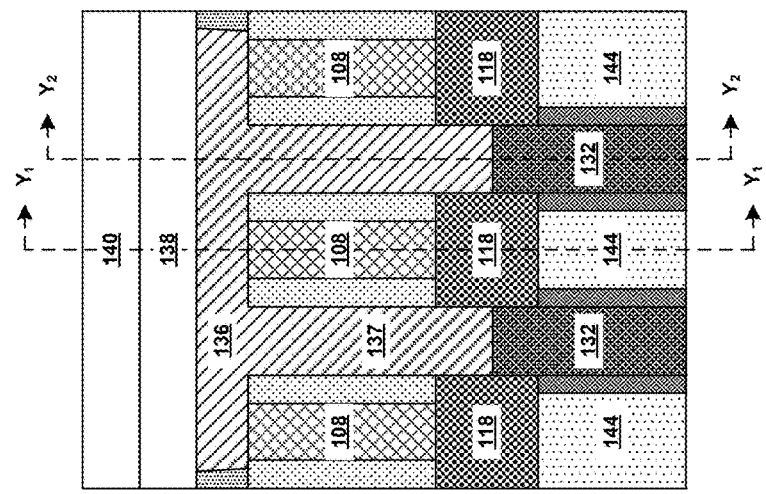
FIG. 38
SECTION X₂-X₂
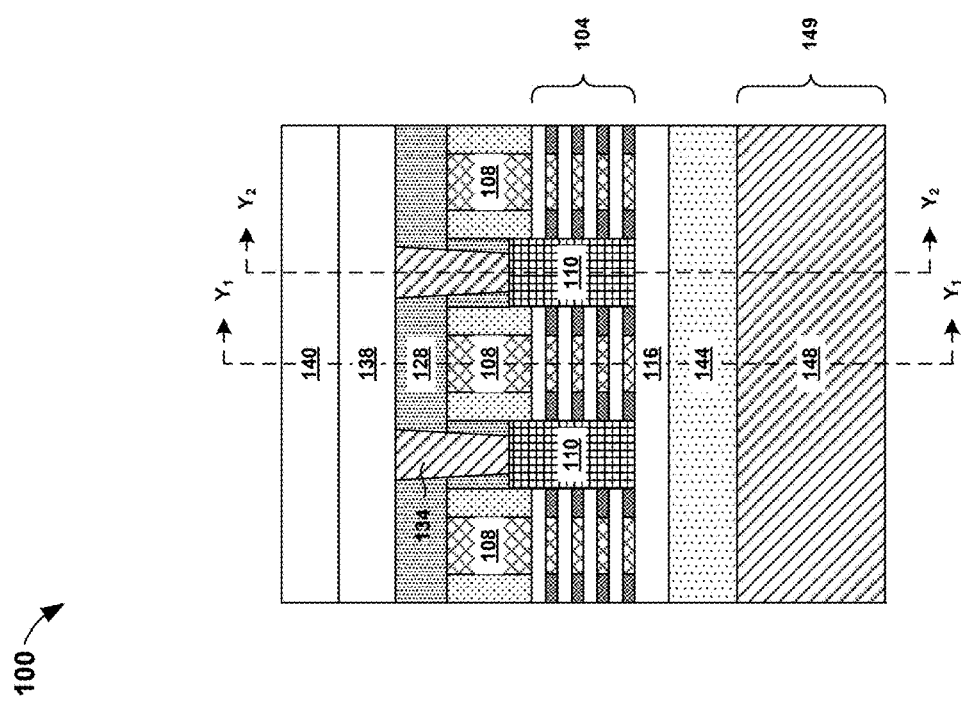
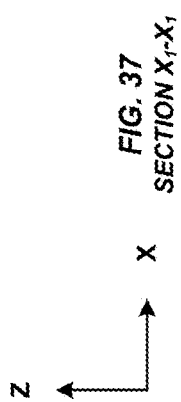
FIG. 37
SECTION X₁-X₁

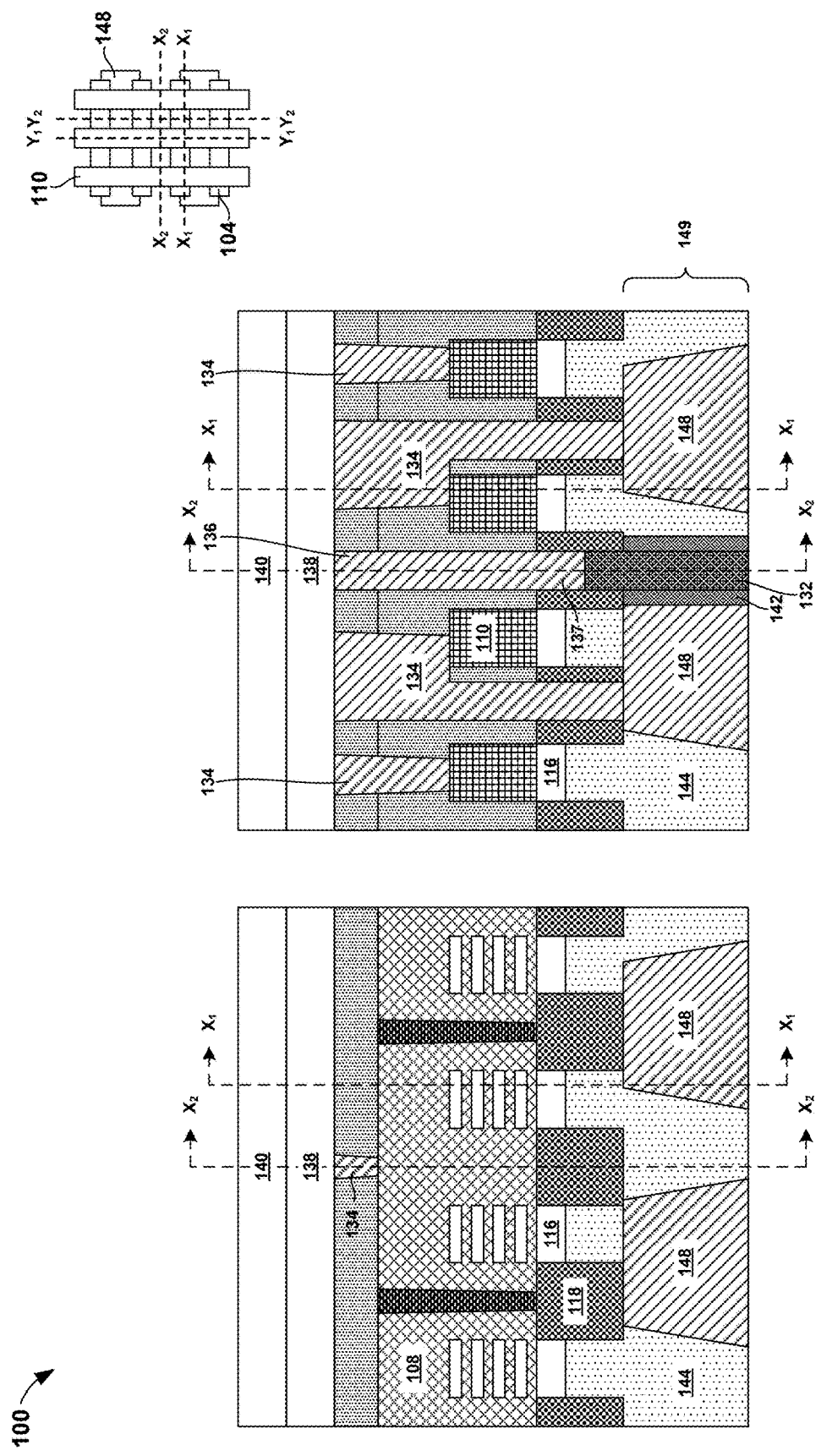
FIG. 39 SECTION Y₁-Y₁
FIG. 40 SECTION Y₂-Y₂

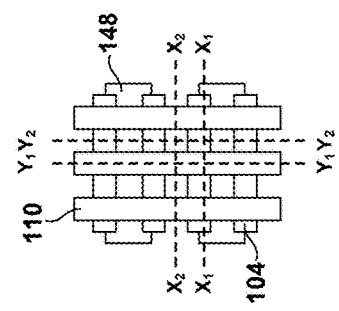
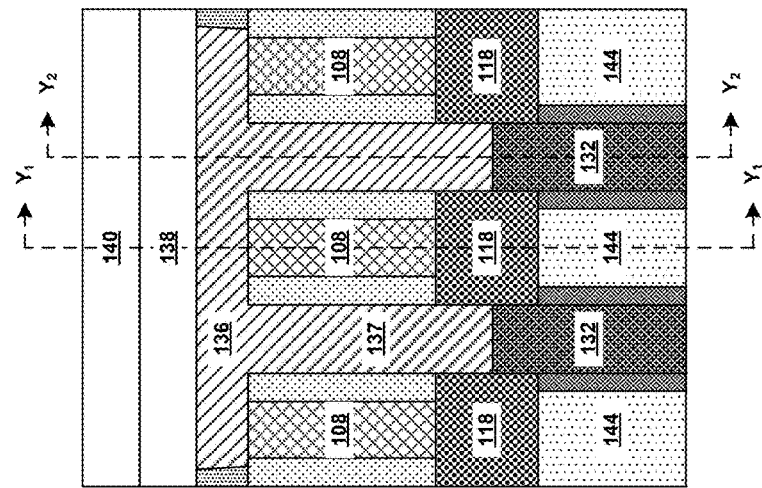
*FIG. 42*
SECTION $X_2$-$X_2$
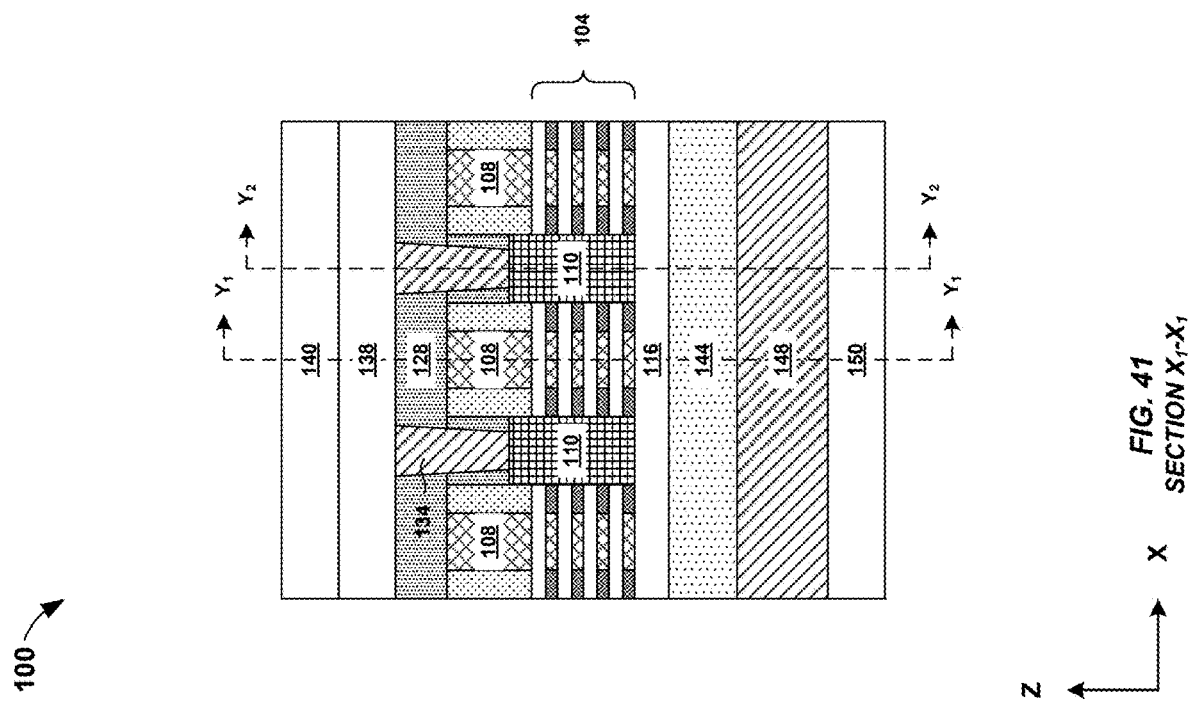
*FIG. 41*
SECTION $X_1$-$X_1$

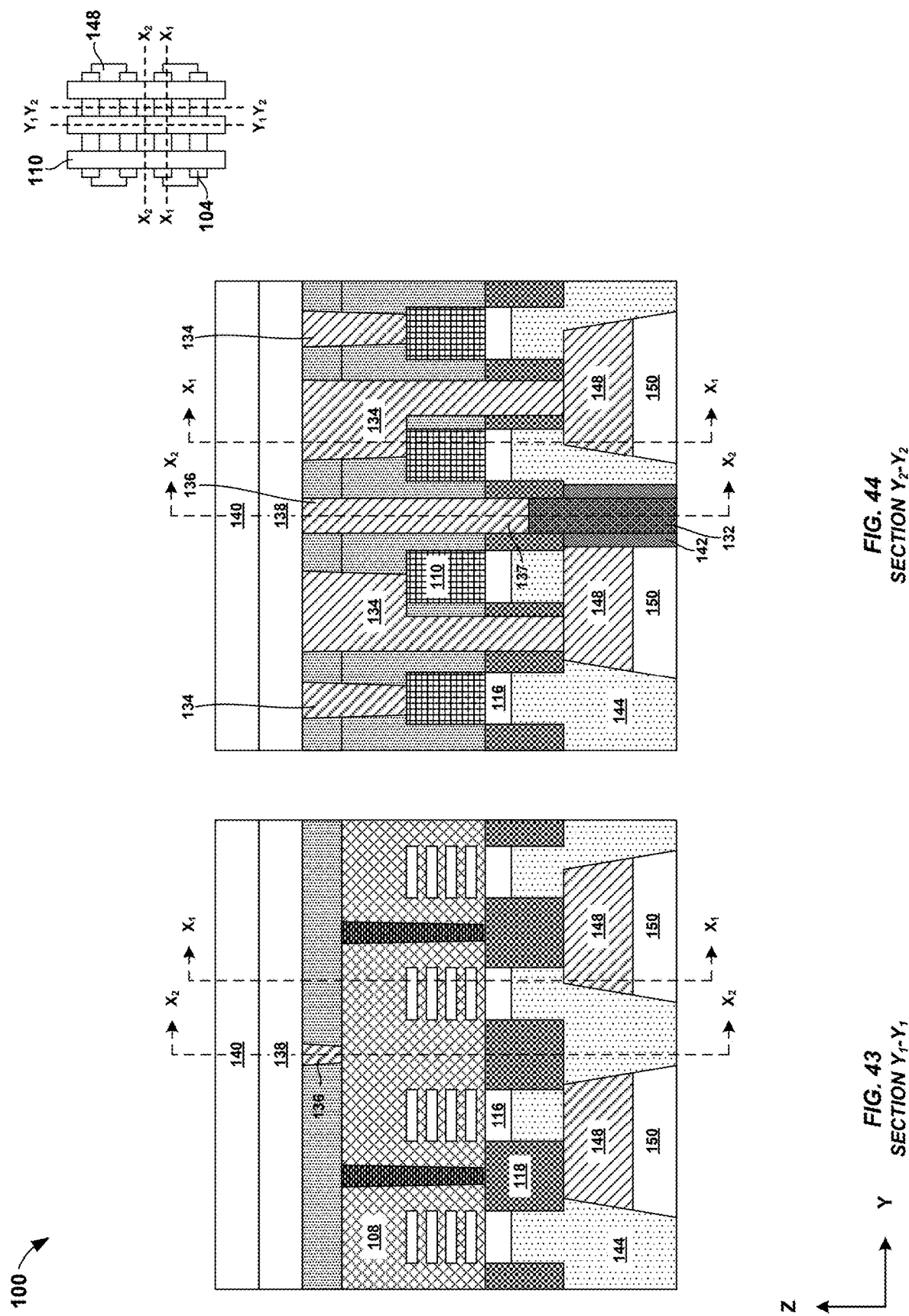
FIG. 43 SECTION Y₁-Y₁
FIG. 44 SECTION Y₂-Y₂

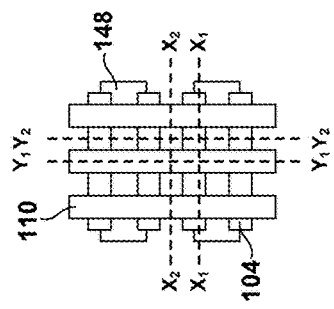
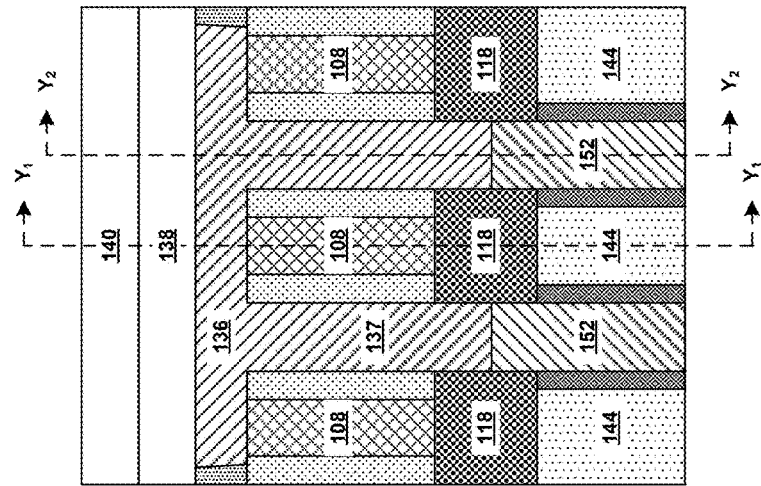
*FIG. 46*
*SECTION $X_2$-$X_2$*
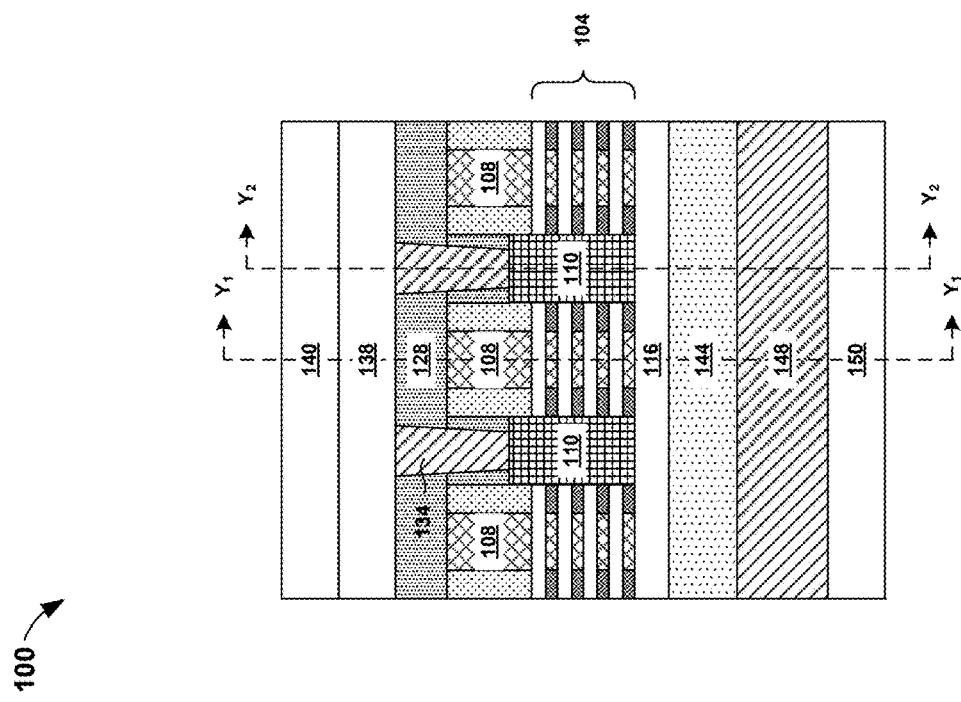
*FIG. 45*
*SECTION $X_1$-$X_1$*

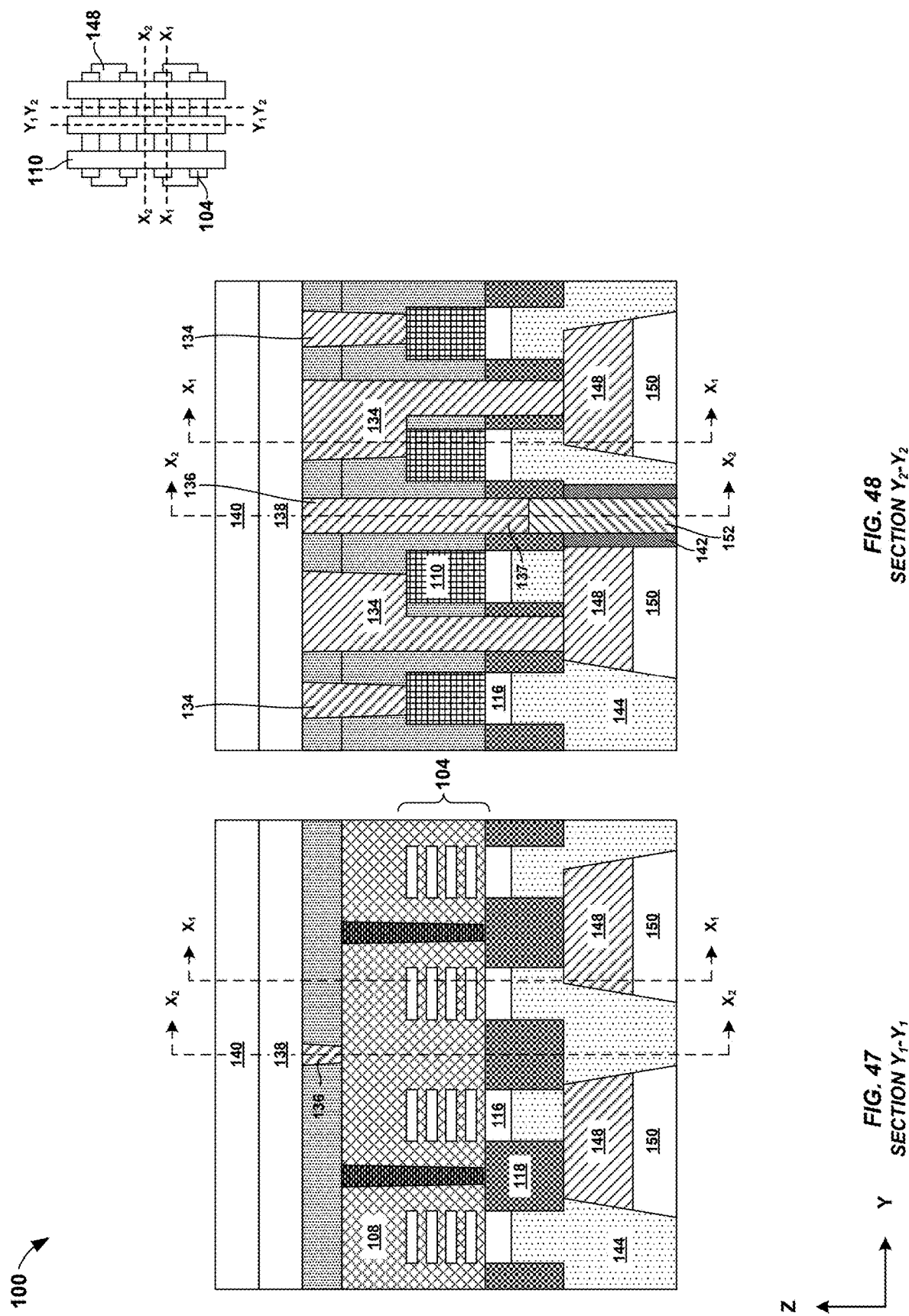

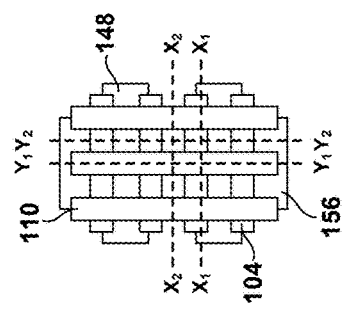
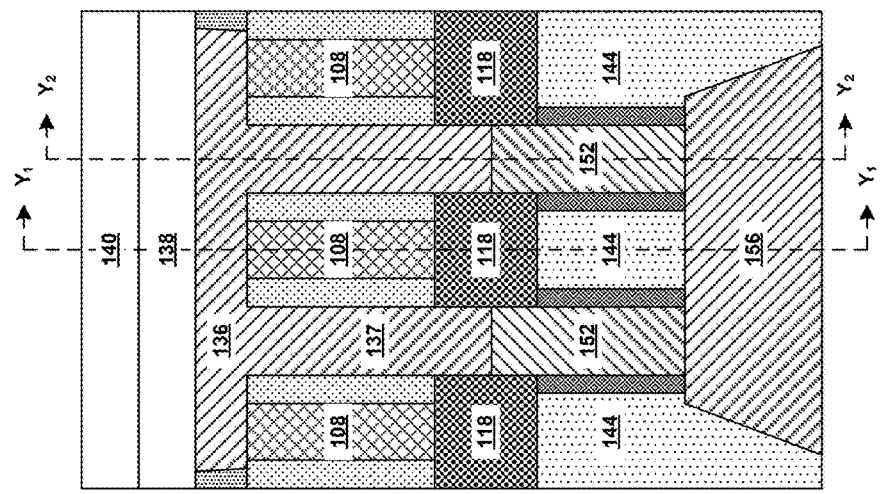
FIG. 50
SECTION X₂-X₂
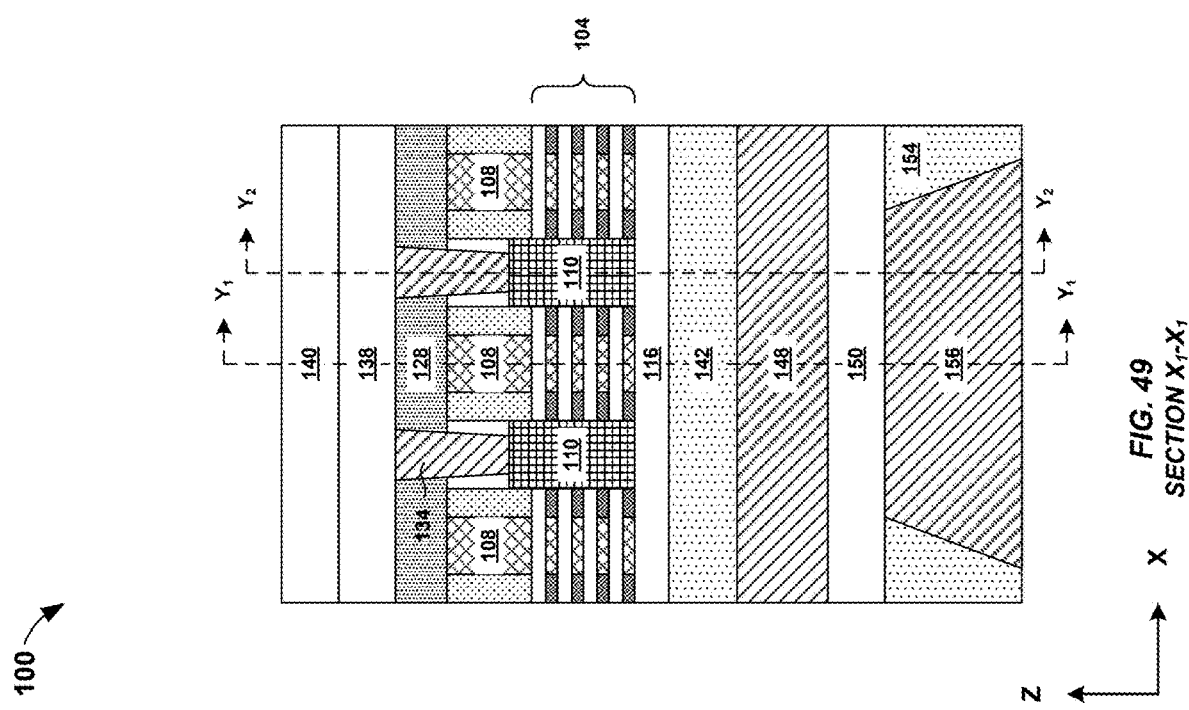
FIG. 49
SECTION X₁-X₁

SECTION Y₁-Y₁

SECTION Y₂-Y₂

BACKSIDE SELF ALIGNED SKIP VIA

BACKGROUND

The present invention generally relates to semiconductor structures, and more particularly to transistor structures having self-aligned skip vias.

Power delivery distribution networks for conventional 3D monolithic designs typically have parallel power busses (e.g., VDD and ground) that are formed as part of a metallization level of a back-end-of-line (BEOL) interconnect network. Vertical interconnects are used to route ground and VDD connections from the upper power busses in the BEOL to the underlying devices.

Such conventional power distribution network solutions for 3D monolithic IC designs present unique challenges. For example, conventional power distribution networks occupy a significant amount of area in each IC layout, thereby limiting integration density.

SUMMARY

According to an embodiment of the present invention, a semiconductor structure is provided. The semiconductor structure may include a gate contact above and in direct contact with a top surface of a gate, a backside wiring layer below a backside power delivery network, and a contact via extending between the gate contact and the backside wiring layer.

According to another embodiment of the present invention, the contact via extends through a shallow trench isolation region.

According to another embodiment of the present invention, the backside power delivery network includes power rails in direct contact with bottom surfaces of source drain regions.

According to another embodiment of the present invention, further including isolation spacers physically separating a portion of the contact via from at least one of the power rails of the backside power delivery network.

According to another embodiment of the present invention, further including a dielectric cap below isolating the backside power delivery network from the backside wiring layer.

According to another embodiment of the present invention, further including a first source drain contact in direct contact with the backside power delivery network, and a second source drain contact in direct contact with a back-end-of-line.

According to another embodiment of the present invention, the contact via is self-aligned to gate spacers.

According to another embodiment of the present invention, a semiconductor structure is provided. The semiconductor structure may include a gate contact above and in direct contact with a top surface of a gate, a backside wiring layer below a backside power delivery network, and a contact via extending between the gate contact and the backside wiring layer, where the contact via includes a continuous tapered profile from the gate contact to the backside wiring layer.

According to another embodiment of the present invention, the contact via extends through a shallow trench isolation region.

According to another embodiment of the present invention, the backside power delivery network includes power rails in direct contact with bottom surfaces of source drain regions.

According to another embodiment of the present invention, further including isolation spacers physically separating a portion of the contact via from at least one of the power rails of the backside power delivery network.

According to another embodiment of the present invention, further including a dielectric cap below isolating the backside power delivery network from the backside wiring layer.

According to another embodiment of the present invention, further including a first source drain contact in direct contact with the backside power delivery network, and a second source drain contact in direct contact with a back-end-of-line.

According to another embodiment of the present invention, the contact via is self-aligned to gate spacers.

According to another embodiment of the present invention, a semiconductor structure is provided. The semiconductor structure may include a gate contact above and in direct contact with a top surface of a gate, a backside wiring layer below a backside power delivery network, and a plurality of contact vias extending between the gate contact and the backside wiring layer, where each of the plurality of contact vias includes a cross-sectional dimension which decreases relative to height from top to bottom.

According to another embodiment of the present invention, the contact via extends through a shallow trench isolation region.

According to another embodiment of the present invention, the backside power delivery network includes power rails in direct contact with bottom surfaces of source drain regions.

According to another embodiment of the present invention, further including isolation spacers physically separating a portion of the contact via from at least one of the power rails of the backside power delivery network.

According to another embodiment of the present invention, further including a dielectric cap below isolating the backside power delivery network from the backside wiring layer.

According to another embodiment of the present invention, further including a first source drain contact in direct contact with the backside power delivery network, and a second source drain contact in direct contact with a back-end-of-line.

BRIEF DESCRIPTION OF THE DRAWINGS

The following detailed description, given by way of example and not intended to limit the invention solely thereto, will best be appreciated in conjunction with the accompanying drawings, in which:

FIGS. 1, 2, 3, and 4 are cross-sectional views of a semiconductor structure during an intermediate step of a method of fabricating a transistor with a self-aligned skip via according to an exemplary embodiment;

FIGS. 5, 6, 7, and 8 are cross-sectional views of the semiconductor structure after forming middle-of-line dielectric layer and deep vias according to an exemplary embodiment;

FIGS. 9, 10, 11, and 12 are cross-sectional views of the semiconductor structure after forming placeholders in the deep vias according to an exemplary embodiment;

FIGS. 13, 14, 15, and 16 are cross-sectional views of the semiconductor structure after forming middle-of-line contact structures and a back-end-of-line and securing a carrier wafer according to an exemplary embodiment;

FIGS. 17, 18, 19, and 20 are cross-sectional views of the semiconductor structure after flipping the structure and recessing the substrate according to an exemplary embodiment;

FIGS. 21, 22, 23, and 24 are cross-sectional views of the semiconductor structure after removing the buried insulator layer and recessing the top semiconductor layer according to an exemplary embodiment;

FIGS. 25, 26, 27, and 28 are cross-sectional views of the semiconductor structure after forming isolation spacers according to an exemplary embodiment;

FIGS. 29, 30, 31, and 32 are cross-sectional views of the semiconductor structure after further recessing remaining portions of the top semiconductor layer and subsequently forming a first backside dielectric layer according to an exemplary embodiment;

FIGS. 33, 34, 35, and 36 are cross-sectional views of the semiconductor structure after forming backside power rail trenches according to an exemplary embodiment;

FIGS. 37, 38, 39, and 40 are cross-sectional views of the semiconductor structure after forming backside power rails according to an exemplary embodiment;

FIGS. 41, 42, 43, and 44 are cross-sectional views of the semiconductor structure after recessing the backside power rails and forming a dielectric cap according to an exemplary embodiment;

FIGS. 45, 46, 47, and 48 are cross-sectional views of the semiconductor structure after removing the placeholders and forming signal contact extensions according to an exemplary embodiment; and FIGS. 49, 50, 51, and 52 are cross-sectional views of the semiconductor structure after forming a second backside dielectric layer and a backside wiring layer according to an exemplary embodiment.

Figure 7:
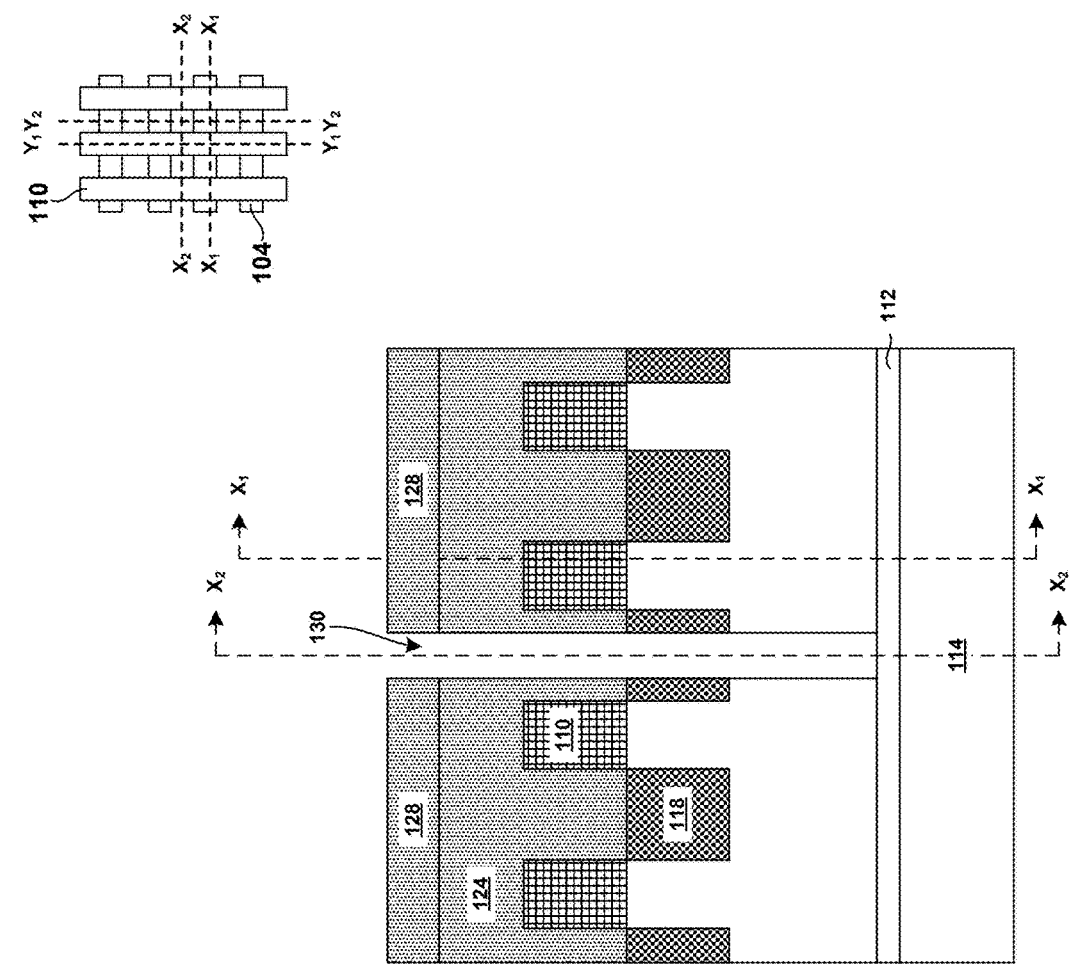

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Forming power delivery networks on a backside of a wafer have known advantages; however, forming electrical connections, for example to backside wiring layers or a backside power delivery network from the frontside of the wafer continues to present challenges as cell spacing decreases with device scaling. Specifically, the electrical connections must be very narrow to fit between adjacent cells and avoid unwanted shorting. Such narrow connections have increased resistance and thereby restrict or otherwise limit device performance.

The present invention generally relates to semiconductor structures, and more particularly to transistor structures having self-aligned skip vias. More specifically, the transistor structures and associated method disclosed herein enable a novel solution for providing unique via connections to backside wiring layers formed during both frontside processing and backside processing. Exemplary embodiments of the exemplary transistors are described in detail below by referring to the accompanying drawings in FIGS. 1 to 52. Those skilled in the art will readily appreciate that the detailed description given herein with respect to these figures is for explanatory purposes as the invention extends beyond these limited embodiments.

Referring now to FIGS. 1, 2, 3, and 4, a structure 100 is shown during an intermediate step of a method of fabricating a transistor with a self-aligned skip via according to an embodiment of the invention. FIG. 1 depicts a cross-sectional view of the structure 100 taken along line $X_1$-$X_1$, FIG. 2 depicts a cross-sectional view of the structure 100 taken along line $X_2$-$X_2$, FIG. 3 depicts a cross-sectional view of the structure 100 taken along line $Y_1$-$Y_1$, and FIG. 4 depicts a cross-sectional view of the structure 100 taken along line $Y_2$-$Y_2$.

The structure 100 illustrated in FIGS. 1-4 includes an array of nanosheet transistors formed on a substrate 102 in accordance with known techniques. As illustrated, the array of nanosheet transistors includes nanosheet stacks 104. Each nanosheet stack 104 includes a plurality of silicon channels 106 surrounded by a gate 108. The array of nanosheet transistors further include source drain regions 110 disposed between adjacent stacks (104) in direct contact with exposed ends of the silicon channels 106. More specifically, the source drain regions 110 may be epitaxially grown from the exposed ends of the silicon channels 106 according to known techniques. For purposes of orientation, the substrate 102 is herein referred to as being on a "backside" of the structure 100 and the array of nanosheet transistors are herein referred to as being on a "frontside" of the structure 100. Further, certain features may be described herein as having a relative position with respect to the frontside or backside of the structure 100.

The substrate 102 may be a layered semiconductor such as a silicon-on-insulator or SiGe-on-insulator, where a buried insulator layer 112, separates a base substrate 114 from a top semiconductor layer 116. Unlike conventional layered semiconductor substrates, the buried insulator layer 112 of the substrate 102 may include any material which affects the desired etch selectivity during subsequent processing. For example, the buried insulator layer 112 may be a conventional buried oxide layer, or it may be a silicon germanium layer with a specific germanium concentration. In practice, the buried insulator layer 112 will function as an etch stop layer and can be composed of any material which supports that function.

In the present embodiment, both the base substrate 114 and the top semiconductor layer 116 may be any bulk substrate made from any of several known semiconductor materials such as, for example, silicon, germanium, silicon-germanium alloy, and compound (e.g. III-V and II-VI) semiconductor materials. For example, both the base substrate 114 and the top semiconductor layer 116 may be made from silicon. Additionally, both the buried insulator layer 112 and the base substrate 114 are sacrificial and will not remain in the final structure. As such, thickness of the top semiconductor layer 116, and similarly the position of the buried insulator layer 112, approximately denote a relative position of subsequently formed backside features, such as, backside wiring layers or a backside power delivery network.

The structure 100 further includes shallow trench isolation regions 118 (hereinafter "STI regions") which extend partially into the substrate 102 below the array of nanosheet transistors. The STI regions 118 may be formed from any appropriate dielectric material including, for example, silicon oxide (SiO) or silicon nitride (SIN).

The structure 100 further includes inner spacers 120 between alternate channels (106). The inner spacers 120 laterally separate the gate 108 from the source drain regions 110, as illustrated. The inner spacers 120 provide necessary electrical insulation between the gate 108 and the source drain regions 110.

When forming the gate 108, gate spacers 122 are added to separate and electrically insulate the gate 108 from subsequently formed structures, such as, for example, contact structures. The gate spacers 122 are critical for electrically insulating the gate 108 from the source drain regions 110 or subsequently formed contact structures. In at least one embodiment, the gate spacers 122 include silicon nitride, silicon boron nitride, silicon carbon nitride, silicon boron carbon nitride, or other known equivalents.

Finally, the structure 100 further includes a dielectric capping layer 124 directly above the source drain regions 110. The dielectric capping layer 124 is composed of any suitable dielectric material, such as, for example, oxides such as silicon oxide ($SiO_x$), nitrides such as silicon nitride ($Si_xN_y$), and/or low-K materials such as SiCOH or SiBCN. In another embodiment, is composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In yet another embodiment, a self-planarizing material such as a spin-on glass (SOG) or a spin-on low-k dielectric material such as SiLK™ can be used to form the dielectric capping layer 124. Using a self-planarizing dielectric material as the dielectric capping layer 124 can avoid the need to perform a subsequent planarizing step. The term "low-K" as used throughout the present application denotes a dielectric material that has a dielectric constant of less than 4.0. After formation, top surfaces of the dielectric capping layer 124 are typically made flush, or substantially flush, with top surfaces of the gates 108 and the gate spacers 122 by CMP.

Finally, the structure 100 includes gate cut insulators 126. The gate cut insulators 126 define individual gate regions of structure 100. In an embodiment, the gate cut insulators 126 are made from SiC, SiOC, or SiCN or other suitable dielectric materials deposited using, for example, chemical vapor deposition (CVD) or plasma enhanced CVD (PECVD). According to the embodiments disclosed herein, individual gate regions defined by the gate cut insulators 126 may include multiple nanosheet transistors devices having a common gate 108. Additionally, the nanosheet transistor devices, and similarly the nanosheet stacks 104 may be N-type, P-type, or any combination thereof. Finally, the gate cut insulators 126 can be positioned anywhere according to a desired design, and are not necessarily limited to the positions and configurations depicted and described herein.

Although only a limited number of components, devices, or structures are shown, embodiments of the present invention shall not be limited by any quantity otherwise illustrated or discussed herein.

Figure 8:
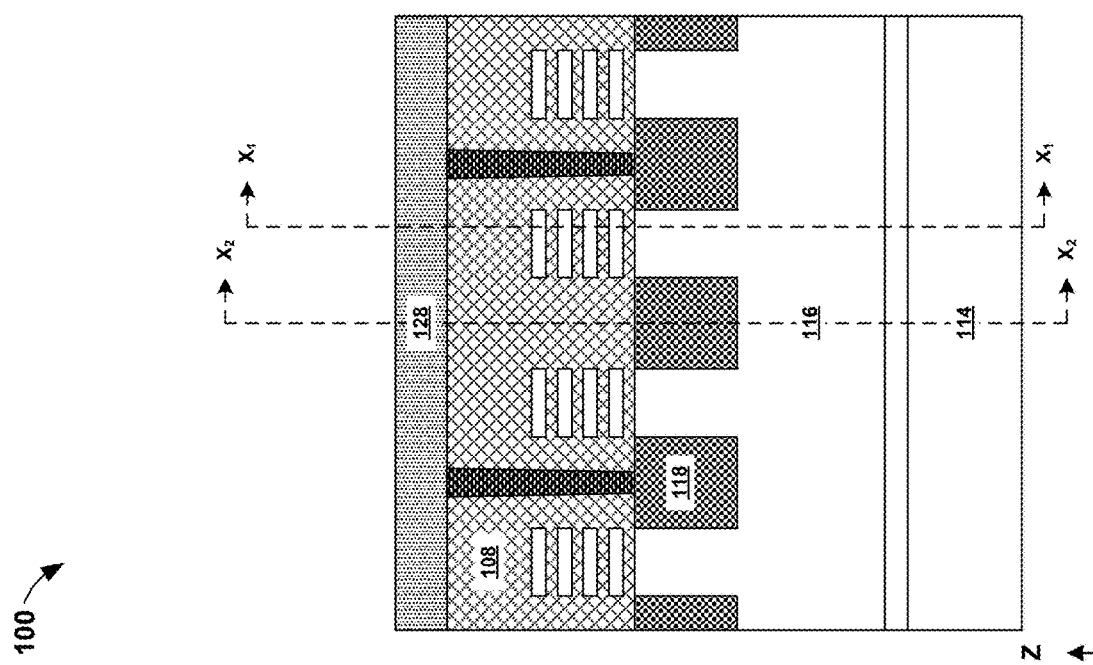

Referring now to FIGS. 5, 6, 7, and 8, the structure 100 is shown after forming middle-of-line dielectric layer 128 and deep vias 130 according to an embodiment of the invention. FIG. 5 depicts a cross-sectional view of the structure 100 taken along line $X_1$-$X_1$, FIG. 6 depicts a cross-sectional view of the structure 100 taken along line $X_2$-$X_2$, FIG. 7 depicts a cross-sectional view of the structure 100 taken along line Y$_1$-Y$_1$, and FIG. 8 depicts a cross-sectional view of the structure 100 taken along line Y$_2$-Y$_2$.

Next, the middle-of-line dielectric layer 128 is formed by blanket depositing an interlayer dielectric material over the structure 100 according to known techniques. The middle-of-line dielectric layer 128 is formed on, and covers, the gates 108, the gate spacers 122 and the dielectric capping layer 124, as illustrated.

Additionally, the middle-of-line dielectric layer 128 can be made from the same or different dielectric materials as the dielectric capping layer 124 described above. As such, despite the middle-of-line dielectric layer 128 and the dielectric capping layer 124 being depicted and described as separate structures, or layers, they may not be distinguishable in the final structure if made from the same, or similar, dielectric material.

Next, the deep vias 130 are formed in a region between adjacent nanosheet stacks 104 and between adjacent gates 108 according to known techniques and as illustrated. In practice, the deep vias 130 may alternatively be referred to as a high-aspect ratio via, contact trenches, or high-aspect ratio contact trenches.

Specifically, a mask (not shown) is first deposited and patterned to expose a portion of the middle-of-line dielectric layer 128 generally located above, and aligned with, at least one of the STI regions 118, as illustrated. Next, known high aspect ratio etching techniques are used to remove portions of the middle-of-line dielectric layer 128, the at least one STI region 118, and the top semiconductor layer 116 selective to the gate spacers 122. Etching continues until the buried insulator layer 112 is exposed at a bottom of the deep vias 130. In all cases, the deep vias 130 must not overlap, or otherwise expose, the gates 108 and the source drain regions 110 nearby. For example, the gate spacers 122 remain between the deep vias 130 and the gates 108, and portions of the dielectric capping layer 124 remain between the deep vias 130 and the source drain regions 110. As such, it is preferable to use a self-aligned etch to preserve the gate spacers 122. In doing so, the deep vias 130 will be self-aligned to the gate spacers 122 to ease fabrication misalignment concerns and maximize a length of the deep vias 130 in at least the x-direction.

As a result of the etching technique used, the deep vias 130 have a continuous tapered profile. More specifically, the deep vias 130 have a cross-sectional dimension which decreases relative to height from top to bottom. Although such tapered profiles are conventional, the tapered profile of the deep via 130 is uniform or continuous from top to bottom.

In at least an embodiment, a directional dry etching technique, such as reactive ion etching, is used to etch or remove portions of the middle-of-line dielectric layer 128, the at least one STI region 118, and the top semiconductor layer 116 selective to the mask.

It is noted, the spacing, or pitch, between adjacent cells is very small, for example, equal to or less than about 40 nm. As such, the deep vias 130 must be even narrower to prevent shorting between adjacent cells. For example, because the spacing is very tight, the aspect ratio of the deep vias 130 must be equal to or greater than about 5:1. Stated differently, the deep vias 130 is expected to be at least 5 times deeper than its width in order to (a) fit between adjacent cells, and (b) fully extend through the various layers and expose the underlying top semiconductor layer 116.

Referring now to FIGS. 9, 10, 11, and 12, the structure 100 is shown after forming placeholders 132 in the deep vias 130 according to an embodiment of the invention. FIG. 9 depicts a cross-sectional view of the structure 100 taken along line X$_1$-X$_1$, FIG. 10 depicts a cross-sectional view of the structure 100 taken along line X$_2$-X$_2$, FIG. 11 depicts a cross-sectional view of the structure 100 taken along line Y$_1$-Y$_1$, and FIG. 12 depicts a cross-sectional view of the structure 100 taken along line Y$_2$-Y$_2$.

The deep vias 130 are filled with a first sacrificial material according to known techniques. After filling, the first sacrificial material is recessed to create the placeholders 132 according to known techniques. In an embodiment, the first sacrificial material is SiC, SiOC deposited using, for example, chemical vapor deposition (CVD) or plasma enhanced CVD (PECVD) and subsequently recessed using, for example, reactive ion etching (RIE). In general, the first sacrificial material is recessed to a depth sufficient to expose at least a portion of the STI regions 118, as illustrated in FIGS. 10 and 12.

It is critical the placeholders 132 has a top surface above a bottommost surface of the STI regions 118. Said differently, it is critical not to recess the first sacrificial material below the bottommost surface of the STI regions 118. Doing so will prevent damage to the deep via metal fill during backside metal recess, as discussed in greater detail below.

Referring now to FIGS. 13, 14, 15, and 16, the structure 100 is shown after forming middle-of-line contact structures and a back-end-of-line 138 (BEOL 138), and securing a carrier wafer 140 according to an embodiment of the invention. FIG. 13 depicts a cross-sectional view of the structure 100 taken along line X$_1$-X$_1$, FIG. 14 depicts a cross-sectional view of the structure 100 taken along line X$_2$-X$_2$, FIG. 14 depicts a cross-sectional view of the structure 100 taken along line Y$_1$-Y$_1$, and FIG. 16 depicts a cross-sectional view of the structure 100 taken along line Y$_2$-Y$_2$.

First, contact trenches (not shown) are formed in the structure 100 according to known techniques. Next, the contact trenches and the deep vias 130 are filled with a conductive material to form the contact structures according to known techniques. The contact structures may include any suitable conductive material, such as, for example, copper, ruthenium, aluminum, tungsten, cobalt, or alloys thereof. In some embodiments, and as applicable, a metal silicide can be formed at the bottom of the contact trenches prior to filling them with the conductive material. After deposition, excess conductive material can be polished using known techniques until a topmost surface of the contact structures are flush, or substantially flush, with topmost surfaces of the middle-of-line dielectric layer 128, as illustrated. The contact structures may include source drain contacts 134 (otherwise CA contacts), gate contacts 136 (otherwise CB contacts).

The source drain contacts 134 land on, and directly contact, top surfaces of the source drain regions 110 as illustrated. Some of the source drain contacts 134 extend between the source drain regions 110 and the BEOL 138, while others have portions which extend vertically down between adjacent source drain regions 110 and entirely through the STI regions 118, as best illustrated in FIG. 16.

The gate contacts 136 are formed directly on top of the gates 108, as best illustrated in FIG. 14. According to embodiments of the present invention, forming the gate contacts 136 further includes simultaneously forming a partial signal contact 137. The partial signal contact 137 fills the deep via 130 (FIGS. 10 and 12). The partial signal contact 137 extends vertically downward between adjacent nanosheet stacks 104 and between adjacent source drain regions 110. For example, the partial signal contact 137 extends between the gate contacts 136 and the placeholders 132, as illustrated. As such, despite the gate contacts 136 and the partial signal contact 137 being described as separate structures or components, they are formed simultaneously from a single homogeneous conductive material and may not be distinguishable in the final structure. As such, both the partial signal contacts 137 and the signal contact extensions 152 are hereinafter collectively referred to as a contact via (137, 152).

After forming the contact structures, the BEOL 138 is subsequently formed according to known techniques. Next, the carrier wafer 140 is attached, or removably secured, to the BEOL 138. In general, and not necessarily depicted, the carrier wafer 140 may be thicker than the other layers. Temporarily bonding the structure 100 to a thicker carrier (140) provides improved handling and additional support for backside processing of thin wafers. After backside processing described below, the structure 100 may be de-bonded, or removed, from the carrier wafer 140 according to known techniques.

Referring now to FIGS. 17, 18, 19, and 20, the structure 100 is shown after flipping the structure 100 and recessing the substrate 102 according to an embodiment of the invention. FIG. 17 depicts a cross-sectional view of the structure 100 taken along line $X_1$-$X_1$, FIG. 18 depicts a cross-sectional view of the structure 100 taken along line $X_2$-$X_2$, FIG. 19 depicts a cross-sectional view of the structure 100 taken along line $Y_1$-$Y_1$, and FIG. 20 depicts a cross-sectional view of the structure 100 taken along line $Y_2$-$Y_2$.

First, the structure 100 is flipped 180 degrees to prepare for backside processing. Although in practice, the structure 100 will likely be physically flipped 180 degrees, the structures illustrated in the figures provided herein are not flipped or rotated, and the features and processes will continue to be described relative to the structure's orientation as illustrated in the figures. In general, backside processing includes fabrication or processing of the structure 100 opposite the active device and wiring layers. Next, the substrate 102 is recessed, and completely removed, to expose the buried insulator layer 112 according to known techniques, as shown.

Figures 23, 24:
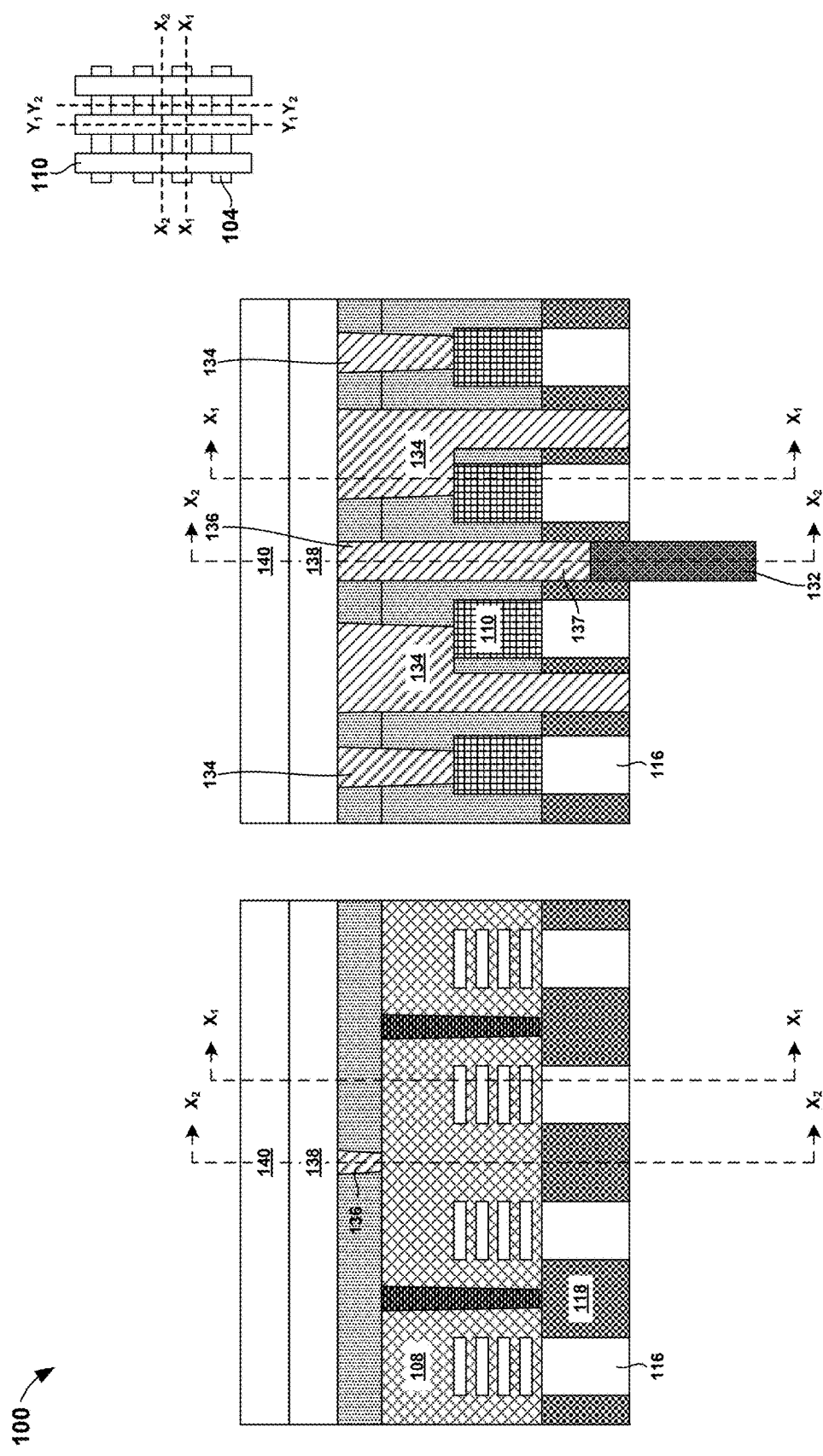

Referring now to FIGS. 21, 22, 23, and 24, the structure 100 is shown after removing the buried insulator layer 112 and recessing the top semiconductor layer 116 according to an embodiment of the invention. FIG. 21 depicts a cross-sectional view of the structure 100 taken along line $X_1$-$X_1$, FIG. 22 depicts a cross-sectional view of the structure 100 taken along line $X_2$-$X_2$, FIG. 23 depicts a cross-sectional view of the structure 100 taken along line $Y_1$-$Y_1$, and FIG. 24 depicts a cross-sectional view of the structure 100 taken along line $Y_2$-$Y_2$.

First, the buried insulator layer 112 is recessed, and completely removed, to expose the top semiconductor layer 116 according to known techniques, as shown. The buried insulator layer 112 is recessed, and completely removed using, for example, reactive ion etching (RIE) or wet etch process. In doing so, the top semiconductor layer 116 is exposed. It is noted, the relative position of the buried insulator layer 112 is preserved by the placeholders 132.

Next, the top semiconductor layer 116 is recessed according to known techniques. The top semiconductor layer 116 is recessed using, for example, reactive ion etching (RIE). In the present embodiment, the top semiconductor layer 116 is removed selective to the STI regions 118, the source drain contacts 134, and the placeholders 132. In fact, etching continues until bottommost surfaces of some of the source drain contacts 134 are exposed, as illustrated. In doing so, the bottommost surfaces of the top semiconductor layer 116 might be recessed beyond the bottommost surfaces of the STI regions 118, and lower portions of the placeholders 132 are exposed, as illustrated.

It is critical the bottom surfaces of the STI regions 118 are exposed after recessing the top semiconductor layer 116 to enable fabrication of subsequent isolation structures necessary for the operation of the final structure, as discussed in more detail below.

Referring now to FIGS. 25, 26, 27, and 28, the structure 100 is shown after forming isolation spacers 142 according to an embodiment of the invention. FIG. 25 depicts a cross-sectional view of the structure 100 taken along line $X_1$-$X_1$, FIG. 26 depicts a cross-sectional view of the structure 100 taken along line $X_2$-$X_2$, FIG. 27 depicts a cross-sectional view of the structure 100 taken along line $Y_1$-$Y_1$, and FIG. 28 depicts a cross-sectional view of the structure 100 taken along line $Y_2$-$Y_2$.

The isolation spacers 142 are formed along exposed vertical sidewalls of the placeholders 132, according to known techniques as shown. The isolation spacers 142 can be formed using known techniques, which includes spacer material deposition followed by directional RIE of the deposited spacer material. In order to maintain functionality, it is critical that the isolation spacers 142 directly contact exposed bottom surfaces of the STI regions 118. Said differently, no portion of the top semiconductor layer 116 shall remain between the isolation spacers 142 and the STI regions 118.

In one or more embodiments, the isolation spacers 142 are made from a nitride containing material, for example silicon nitride (SiN). Although the isolation spacers 142 disclosed herein are often formed from a nitride containing material, they can be formed from any material which supports selectivity during subsequent device fabrication operations and ensure necessary electrical isolation, as described in greater detail below.

Referring now to FIGS. 29, 30, 31, and 32, the structure 100 is shown after further recessing remaining portions of the top semiconductor layer 116 and subsequently forming a first backside dielectric layer 144 according to an embodiment of the invention. FIG. 29 depicts a cross-sectional view of the structure 100 taken along line $X_1$-$X_1$, FIG. 30 depicts a cross-sectional view of the structure 100 taken along line $X_2$-$X_2$, FIG. 31 depicts a cross-sectional view of the structure 100 taken along line $Y_1$-$Y_1$, and FIG. 32 depicts a cross-sectional view of the structure 100 taken along line $Y_2$-$Y_2$.

First, the top semiconductor layer 116 is further recessed according to known techniques. The top semiconductor layer 116 is further recessed using, for example, reactive ion etching (RIE). In the present embodiment, the top semiconductor layer 116 is removed selective to the STI regions 118, the source drain contacts 134, the placeholders 132, and the isolation spacers 142. In fact, etching continues until a majority of the top semiconductor layer 116 is removed from the structure 100 without exposing the source drain regions 110.

Next, the first backside dielectric layer 144 is formed according to known techniques. More specifically, the first backside dielectric layer 144 is deposited directly on the structure 100 and fills the openings and spaces left by removing the top semiconductor layer 116. In most cases, the first backside dielectric layer 144 will be blanket deposited across surfaces of the structure 100 at large but subsequently removed or polished by known techniques. More specifically, after polishing a bottommost surface of the first backside dielectric layer 144 is flush, or substantially flush, with bottommost surfaces of the placeholders 132 and the isolation spacers 142, as illustrated. The first backside dielectric layer 144 can be composed of any known dielectric materials, for example, known interlevel dielectric materials. Additionally, for example, the first backside dielectric layer 144 can be made from the same or different dielectric materials as the middle-of-line dielectric layer 128 described above.

Referring now to FIGS. 33, 34, 35, and 36, the structure 100 is shown after forming backside power rail trenches 146 according to an embodiment of the invention. FIG. 33 depicts a cross-sectional view of the structure 100 taken along line $X_1$-$X_1$, FIG. 34 depicts a cross-sectional view of the structure 100 taken along line $X_2$-$X_2$, FIG. 35 depicts a cross-sectional view of the structure 100 taken along line $Y_1$-$Y_1$, and FIG. 36 depicts a cross-sectional view of the structure 100 taken along line $Y_2$-$Y_2$.

The backside power rail trenches 146 are formed using known patterning and etching techniques. Specifically, a mask (not shown) is first deposited and patterned to expose a portion of the first backside dielectric layer 144. Next, known etching techniques are used to remove portions of the first backside dielectric layer 144 selective to the mask, the isolation spacers 142, and the placeholders 132 until bottommost surfaces of the STI regions 118 and the source drain contacts 134 are exposed. In general, and according to embodiments of the present invention, the backside power rail trenches 146 run perpendicular to the gates 108 and are approximately aligned below the gate cut insulators 126, as illustrated. In at least an embodiment, a directional dry etching technique, such as reactive ion etching, is used to etch or remove portions of the first backside dielectric layer 144.

Referring now to FIGS. 37, 38, 39, and 40, the structure 100 is shown after forming backside power rails 148 according to an embodiment of the invention. FIG. 37 depicts a cross-sectional view of the structure 100 taken along line $X_1$-$X_1$, FIG. 38 depicts a cross-sectional view of the structure 100 taken along line $X_2$-$X_2$, FIG. 39 depicts a cross-sectional view of the structure 100 taken along line $Y_1$-$Y_1$, and FIG. 40 depicts a cross-sectional view of the structure 100 taken along line $Y_2$-$Y_2$.

First, backside power rail trenches 146 are filled with a conductive material to form the backside power rails 148 according to known techniques. The backside power rails 148 may include any suitable conductive material, such as, for example, copper, ruthenium, aluminum, tungsten, cobalt, or alloys thereof. After deposition, excess conductive material can be polished using known techniques until a bottommost surface of the backside power rails 148 are flush, or substantially flush, with bottommost surfaces of the first backside dielectric layer 144, the isolation spacers 142, and the placeholders 132, as illustrated. As previously mentioned, the relative position of the buried insulator layer 112 was preserved by the placeholders 132, which now denotes a relative position of the backside power rails 148.

After formation, the backside power rails 148 directly contact bottommost surfaces of some of the source drain contacts 134, as best illustrated in FIG. 40. As such, some of the source drain contacts 134 are in electrical contact with wiring on the frontside of the structure 100, and other source drain contacts 134 are in electrical contact with wiring on a backside of the structure 100. For example, some of the source drain contacts 134 directly connect to the BEOL 138, and the other source drain contacts 134 directly connect to the backside power rails 148. In most embodiments, the backside power rails 148 are part of a backside power delivery network 149.

It is further noted, some of the backside power rail trenches 146, and subsequently some of the backside power rails 148, overlap or intersect with the isolation spacers 142 and the placeholders 132. At this stage of fabrication, it is critical for the isolation spacers 142 physically separate the backside power rails 148 from the placeholders 132.

Referring now to FIGS. 41, 42, 43, and 44, the structure 100 is shown after recessing the backside power rails 148 and forming a dielectric cap 150 according to an embodiment of the invention. FIG. 41 depicts a cross-sectional view of the structure 100 taken along line $X_1$-$X_1$, FIG. 42 depicts a cross-sectional view of the structure 100 taken along line $X_2$-$X_2$, FIG. 43 depicts a cross-sectional view of the structure 100 taken along line $Y_1$-$Y_1$, and FIG. 44 depicts a cross-sectional view of the structure 100 taken along line $Y_2$-$Y_2$.

First, the backside power rails 148 are recessed according to known techniques. Specifically, the backside power rails 148 are recessed to provide electrical isolation from subsequently formed conductive structures. As such, the resulting recesses need only be deep enough for an adequate volume of dielectric material according to known techniques. The backside power rails 148 are recessed using, for example, reactive ion etching (RIE). As with the previous etching techniques used to form the backside power rail trenches 146, the etching technique used here to recess the backside power rails 148 should etch the first backside dielectric layer 144 selective to the isolation spacers 142 and the placeholders 132.

Next, the dielectric cap 150 is formed according to known techniques. More specifically, a dielectric material is blanket deposited directly on the structure 100 and fills the openings and spaces left by recessing backside power rails 148. The dielectric material is subsequently removed or polished by known techniques leaving the dielectric cap 150. More specifically, after polishing a bottommost surface of the dielectric cap 150 is flush, or substantially flush, with bottommost surfaces of the first backside dielectric layer 144, the isolation spacers 142, and the placeholders 132, as illustrated. The dielectric cap 150 can be composed of any known dielectric materials suitable for providing adequate electrical isolation from the subsequently formed conductive structures. For example, the dielectric cap 150 can be made from the same or different dielectric materials as the dielectric capping layer 124 described above.

As previously mentioned, the relative position of the buried insulator layer 112 was preserved by the placeholders 132, which now denotes a relative position of both the backside power rails 148 and the dielectric cap 150. Thus, like the placeholders 132, the placeholders 132 are adjacent to, and extend below the backside power rails 148.

Referring now to FIGS. 45, 46, 47, and 48, the structure 100 is shown after removing the placeholders 132 and forming signal contact extensions 152 according to an embodiment of the invention. FIG. 45 depicts a cross-sectional view of the structure 100 taken along line $X_1$-$X_1$, FIG. 46 depicts a cross-sectional view of the structure 100 taken along line $X_2$-$X_2$, FIG. 47 depicts a cross-sectional view of the structure 100 taken along line $Y_1$-$Y_1$, and FIG. 48 depicts a cross-sectional view of the structure 100 taken along line $Y_2$-$Y_2$.

First, the placeholders 132 are recessed, and completely removed, according to known techniques. The placeholders 132 are recessed, and completely removed using, for example, reactive ion etching (RIE). In the present embodiment, the placeholders 132 are removed selective to the isolation spacers 142, the dielectric cap 150, and the first backside dielectric layer 144. In fact, etching continues until the placeholders 132 are completely removed and bottommost surfaces of the gate contacts 136 are fully exposed.

Next, the signal contact extensions 152 are formed according to known techniques. More specifically, the signal contact extensions 152 are deposited directly on the structure 100 and fills the openings and spaces left by removing the placeholders 132. In most cases, a conductive material will be blanket deposited across surfaces of the structure 100 at large but subsequently removed or polished by known techniques. More specifically, after polishing a bottommost surface of the signal contact extensions 152 are flush, or substantially flush, with bottommost surfaces of the first backside dielectric layer 144, the dielectric cap 150, and the isolation spacers 142, as illustrated. The signal contact extensions 152 can be composed of any known conductive materials, for example, contact materials. Additionally, for example, the signal contact extensions 152 can be made from the same or different conductive materials as the gate contacts 136 described above. As previously mentioned, the relative position of the buried insulator layer 112 was preserved by the placeholders 132, which now denotes a relative position of the signal contact extensions 152. Thus, like the placeholders 132, the signal contact extensions 152 are adjacent to, and extend below the backside power rails 148.

It is critical the signal contact extensions 152 remain electrically isolated from the backside power rails 148. Said differently, it is critical for the isolation spacers 142 physically separate the signal contact extensions 152 from the backside power rails 148.

Figures 51, 52:
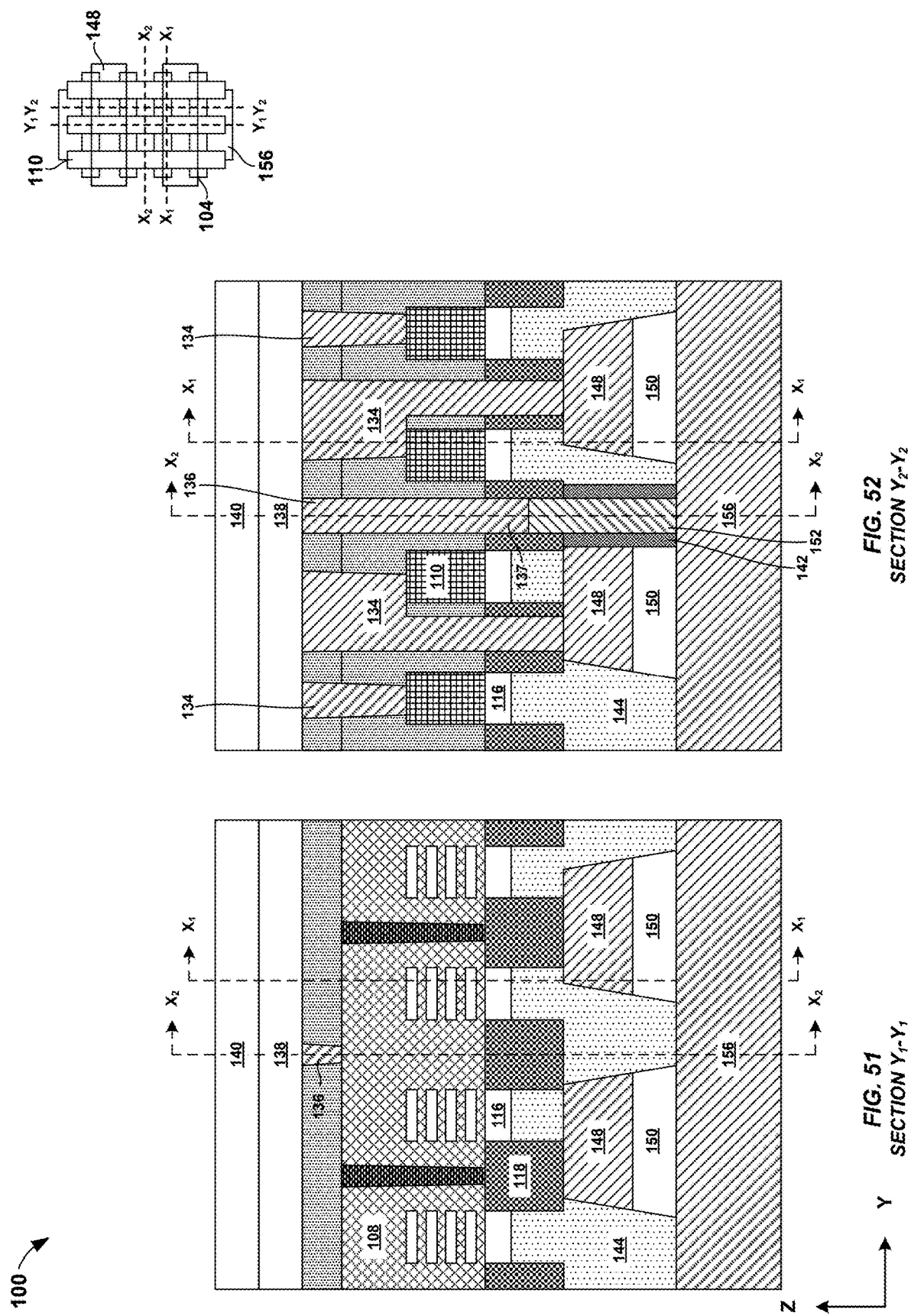

Referring now to FIGS. 49, 50, 51, and 52, the structure 100 is shown after forming a second backside dielectric layer 154 and a backside wiring 156 according to an embodiment of the invention. FIG. 49 depicts a cross-sectional view of the structure 100 taken along line $X_1$-$X_1$, FIG. 50 depicts a cross-sectional view of the structure 100 taken along line $X_2$-$X_2$, FIG. 51 depicts a cross-sectional view of the structure 100 taken along line $Y_1$-$Y_1$, and FIG. 52 depicts a cross-sectional view of the structure 100 taken along line $Y_2$-$Y_2$.

First, the second backside dielectric layer 154 is formed by blanket depositing a dielectric material over the structure 100 according to known techniques. The second backside dielectric layer 154 is formed on, and covers, the first backside dielectric layer 144, the dielectric cap 150, the isolation spacers 142, and the signal contact extensions 152.

Additionally, for example, the second backside dielectric layer 154 can be made from the same or different dielectric materials as the first backside dielectric layer 144 described above. As such, despite the second backside dielectric layer 154 and the first backside dielectric layer 144 being depicted and described as separate structures, or layers, they may not be distinguishable in the final structure if made from the same, or similar, dielectric material.

Next, the backside wiring trenches (not shown) are formed using known patterning and etching techniques. Specifically, a mask (not shown) is first deposited and patterned to expose a portion of the second backside dielectric layer 154. Next, known etching techniques are used to remove portions of the second backside dielectric layer 154 selective to the mask, the dielectric cap 150, the isolation spacers 142, and the signal contact extensions 152 until at least bottommost surfaces of the signal contact extensions 152 are exposed. In at least an embodiment, a directional dry etching technique, such as reactive ion etching, is used to etch or remove portions of the second backside dielectric layer 154.

Finally, the backside wiring trenches are filled with a conductive material to form the backside wiring 156 according to known techniques. The backside wiring 156 may include any suitable conductive material, such as, for example, copper, ruthenium, aluminum, tungsten, cobalt, or alloys thereof. After deposition, excess conductive material can be polished using known techniques until a bottommost surface of the backside wiring 156 is flush, or substantially flush, with bottommost surfaces of the second backside dielectric layer 154, as illustrated. After formation, the backside wiring 156 directly contacts bottommost surfaces of some of the signal contact extensions 152, as illustrated. As such, some of the gate contacts 136 are in direct electrical contact with wiring on the backside of the structure 100. For example, the contact via (137, 152) forms a direct connection between some of the gate contacts 136 and the backside wiring 156.

As illustrated in FIGS. 49, 50, 51, and 52, the transistor structures represented by the structure 100 have some distinctive notable features. For purposes of this description the structure 100 illustrated in the figures and described herein includes multiple transistor structures positioned adjacent, or next, to one another, and manufactured in a single replacement gate process flow. Further, the multiple transistor structures have a nanosheet or gate-all-around structure.

In sum, the structure 100 and associated process flow enable manufacturing of transistor structures having self-aligned skip vias. As described above, the partial signal contacts 137 and the signal contact extensions 152 are herein collectively referred to as the contact via (137, 152). In the context of the following description the contact via (137, 152) is a self-aligned skip via.

Even more specifically, the contact vias (137, 152) have a relatively high-aspect ratio and are fabricated in multiple stages to prevent void formation and eliminate misalignment. For example, the contact vias (137, 152) of the present invention is formed using two metallization steps, one from the frontside and one from the backside. Doing so helps eliminate the potential for void formation. Additionally, by etching the entire depth of the deep via 130 from the frontside and formation of the placeholders 132 allow for near perfect alignment, or self-alignment, during the second metallization step.

Further, since the contact vias (137, 152) are formed within the deep via 130, it too has a continuous tapered profile. More specifically, the contact vias (137, 152) have a cross-sectional dimension which decreases relative to height from top to bottom. Said differently, a width of the contact vias (137, 152) where they intersect with the backside wiring 156 is smaller than a width of the contact vias (137, 152) where they intersect the gate contacts 136. In all cases, the profile of the contact via (137, 152) is consistent with the profile of the deep via 130.

With continued reference to FIGS. 49-52, according to an embodiment the transistor structures represented by the structure 100 include gate contacts (136) above and in direct contact with a top surface of a gate (108), backside wiring (156) below a backside power delivery network (149), and a contact via (137, 152) extending between the gate contacts (136) and the backside wiring (156).

With continued reference to FIGS. 49-52, and according to an embodiment, the contact via (137, 152) extends through a shallow trench isolation region (118).

With continued reference to FIGS. 49-52, and according to an embodiment, the backside power delivery network (149) includes power rails (148) in direct contact with bottom surfaces of source drain regions (110).

With continued reference to FIGS. 49-52, and according to an embodiment, the structure 100 further includes isolation spacers (142) physically separating a portion of the contact via (137, 152) from at least one of the power rails (148) of the backside power delivery network (149).

With continued reference to FIGS. 49-52, and according to an embodiment, the structure 100 further includes a dielectric cap (124) below isolating the backside power delivery network (149) from the backside wiring (156).

With continued reference to FIGS. 49-52, and according to an embodiment, the structure 100 further includes a first source drain contact (134) in direct contact with the backside power delivery network (149), and a second source drain contact (134) in direct contact with a back-end-of-line (138).

With continued reference to FIGS. 49-52, and according to an embodiment, the contact via (137, 152) is self-aligned to gate spacers (122).

With continued reference to FIGS. 49-52, according to an embodiment the transistor structures represented by the structure 100 include gate contacts (136) above and in direct contact with a top surface of a gate (108), a backside wiring (156) below a backside power delivery network (149), and a contact via (137, 152) extending between the gate contacts (136) and the backside wiring (156), where the contact via (137, 152) includes a continuous tapered profile from the gate contacts (136) to the backside wiring (156).

With continued reference to FIGS. 49-52, according to an embodiment the transistor structures represented by the structure 100 include gate contacts (136) above and in direct contact with a top surface of a gate (108), backside wiring (156) below a backside power delivery network (149), and a plurality of contact vias (137, 152) extending between the gate contacts (136) and the backside wiring (156), where each of the plurality of contact vias (137, 152) includes a cross-sectional dimension which decreases relative to height from top to bottom.

For reference purposes measurements taken in the x-direction, perpendicular to the gates 108, are herein referred to as "length", while measurements taken in the y-direction, parallel to the gates 108, are herein referred to as "width".

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
    a gate contact above and in direct contact with a top surface of a gate;
    a backside wiring layer below a backside power delivery network; and
    a contact via extending between the gate contact and the backside wiring layer.

2. The semiconductor structure according to claim 1, wherein the contact via extends through a shallow trench isolation region.

3. The semiconductor structure according to claim 1, wherein the backside power delivery network comprises power rails in direct contact with bottom surfaces of source drain regions.

4. The semiconductor structure according to claim 3, further comprising:
    isolation spacers physically separating a portion of the contact via from at least one of the power rails of the backside power delivery network.

5. The semiconductor structure according to claim 1, further comprising:
    a dielectric cap isolating the backside power delivery network from the backside wiring layer.

6. The semiconductor structure according to claim 1, further comprising:
    a first source drain contact in direct contact with the backside power delivery network; and
    a second source drain contact in direct contact with a back-end-of-line.

7. The semiconductor structure according to claim 1, wherein the contact via is self-aligned to gate spacers.

8. A semiconductor structure comprising:
    a gate contact above and in direct contact with a top surface of a gate;
    a backside wiring layer below a backside power delivery network; and
    a contact via extending between the gate contact and the backside wiring layer, wherein the contact via comprises a continuous tapered profile from the gate contact to the backside wiring layer.

9. The semiconductor structure according to claim 8, wherein the contact via extends through a shallow trench isolation region.

10. The semiconductor structure according to claim 8, wherein the backside power delivery network comprises power rails in direct contact with bottom surfaces of source drain regions.

11. The semiconductor structure according to claim 10, further comprising:
    isolation spacers physically separating a portion of the contact via from at least one of the power rails of the backside power delivery network.

12. The semiconductor structure according to claim 8, further comprising:
    a dielectric cap isolating the backside power delivery network from the backside wiring layer.

13. The semiconductor structure according to claim 8, further comprising:
    a first source drain contact in direct contact with the backside power delivery network; and
    a second source drain contact in direct contact with a back-end-of-line.

14. The semiconductor structure according to claim 8, wherein the contact via is self-aligned to gate spacers.

15. A semiconductor structure comprising:
    a gate contact above and in direct contact with a top surface of a gate;
    a backside wiring layer below a backside power delivery network; and
    a plurality of contact vias extending between the gate contact and the backside wiring layer, wherein each of the plurality of contact vias comprises a cross-sectional dimension which decreases relative to height from top to bottom.

16. The semiconductor structure according to claim 15, wherein the plurality of contact vias extend through a shallow trench isolation region.

17. The semiconductor structure according to claim 15, wherein the backside power delivery network comprises power rails in direct contact with bottom surfaces of source drain regions.

18. The semiconductor structure according to claim 17, further comprising:
   isolation spacers physically separating a portion of the plurality of contact vias from at least one of the power rails of the backside power delivery network.

19. The semiconductor structure according to claim 15, further comprising:
   a dielectric cap isolating the backside power delivery network from the backside wiring layer.

20. The semiconductor structure according to claim 15, further comprising:
   a first source drain contact in direct contact with the backside power delivery network; and
   a second source drain contact in direct contact with a back-end-of-line.

* * * * *